(12) United States Patent
Gonzalez

(10) Patent No.: US 10,361,108 B2
(45) Date of Patent: Jul. 23, 2019

(54) AMBIDEXTROUS CASSETTE AND METHODS OF USING SAME

(71) Applicant: SolarCity Corporation, San Mateo, CA (US)

(72) Inventor: Pablo Gonzalez, Fremont, CA (US)

(73) Assignee: SolarCity Corporation, San Mateo, CA (US)

( * ) Notice: Subject to any disclaimer, the term of this patent is extended or adjusted under 35 U.S.C. 154(b) by 574 days.

(21) Appl. No.: 14/985,260

(22) Filed: Dec. 30, 2015

(65) Prior Publication Data

US 2017/0170037 A1    Jun. 15, 2017

Related U.S. Application Data

(60) Provisional application No. 62/267,274, filed on Dec. 14, 2015.

(51) Int. Cl.
*H01L 21/67* (2006.01)
*H01L 21/673* (2006.01)
(Continued)

(52) U.S. Cl.
CPC .... *H01L 21/6773* (2013.01); *H01L 21/67201* (2013.01); *H01L 21/67303* (2013.01); *H01L 21/67309* (2013.01); *H01L 21/67313* (2013.01); *H01L 21/67373* (2013.01); *H01L 21/67379* (2013.01); *H01L 21/67386* (2013.01); *H01L 21/67393* (2013.01); *H01L 21/67757* (2013.01);
(Continued)

(58) Field of Classification Search
CPC ... B65D 85/30; B65D 85/48; H01L 21/37386; H01L 21/67; H01L 21/67039; H01L 21/67201; H01L 21/673; H01L 21/67309; H01L 21/67313; H01L 21/6732; H01L 21/67379; H01L 21/6773; H01L 21/67766; H01L 21/67772; H01L 31/02; H01L 31/50; H02S 50/10

USPC .......... 141/65; 206/232, 326, 454, 701, 703, 206/711, 722, 832; 211/41.18; 220/326, 220/377; 414/164, 217, 217.1, 225.01

See application file for complete search history.

(56) References Cited

U.S. PATENT DOCUMENTS

| | | | | |
|---|---|---|---|---|
| 4,995,430 A | * | 2/1991 | Bonora | ............. H01L 21/67373 141/383 |
| 5,570,987 A | * | 11/1996 | McKenna | ......... H01L 21/67373 414/416.01 |

(Continued)

*Primary Examiner* — Anthony D Stashick
*Assistant Examiner* — Kaushikkumar A Desai
(74) *Attorney, Agent, or Firm* — Kilpatrick Townsend & Stockton LLP

(57) ABSTRACT

Devices and methods for transferring solar cells while maintaining a controlled environment are provided. Such devices include a solar cell carrying cassette adapted to support a stack of solar cells within a solar cell carrying pod that maintains a sealed micro-environment of inert gas and allows for automated transfer of solar cells between the pod and a fabrication line. The solar cell carrying cassette includes a pair of end plates and a plurality of rods extending therebetween that are configured to support a stack of solar cells. An identifier, such as an RFID chip, is included in each of the pair of end plates so as to allow for ready identification of the cassette from a single location relative the pod, while the cassette is coupled within the pod, regardless of the orientation of the cassette within the pod.

21 Claims, 18 Drawing Sheets

(51) Int. Cl.
*H01L 21/677* (2006.01)
*H01L 21/687* (2006.01)

(52) U.S. Cl.
CPC .. *H01L 21/67766* (2013.01); *H01L 21/67772* (2013.01); *H01L 21/67778* (2013.01); *H01L 21/68707* (2013.01)

(56) References Cited

U.S. PATENT DOCUMENTS

| | | | | |
|---|---|---|---|---|
| 5,713,711 | A * | 2/1998 | McKenna | H01L 21/67373 414/217.1 |
| 5,890,597 | A * | 4/1999 | Fan | H01L 21/67369 206/454 |
| 6,010,008 | A * | 1/2000 | Nyseth | H01L 21/67369 206/454 |
| 6,092,981 | A * | 7/2000 | Pfeiffer | H01L 21/67303 206/710 |
| 6,098,809 | A | 8/2000 | Okada et al. | |
| 6,123,120 | A | 9/2000 | Yotsumoto et al. | |
| 6,341,935 | B1 * | 1/2002 | Tseng | H01L 21/67303 118/500 |
| 6,427,096 | B1 | 7/2002 | Lewis et al. | |
| 6,428,729 | B1 | 8/2002 | Bhatt et al. | |
| 6,432,849 | B1 * | 8/2002 | Endo | H01L 21/6732 206/710 |
| 6,736,268 | B2 * | 5/2004 | Nyseth | H01L 21/67373 206/454 |
| 6,871,741 | B2 * | 3/2005 | Bhatt | G03F 7/70691 206/454 |
| 7,225,934 | B2 * | 6/2007 | Shon | H01L 21/6734 211/41.18 |
| 7,325,698 | B2 | 2/2008 | Halbmaier | |
| 7,325,934 | B2 * | 2/2008 | Schofield | B60N 2/002 359/604 |
| 7,618,225 | B2 * | 11/2009 | Chen | H01L 21/67369 206/710 |
| 7,798,758 | B2 | 9/2010 | Bufano et al. | |
| 7,922,000 | B2 | 4/2011 | Hyobu | |
| 7,967,147 | B2 | 6/2011 | Mimura | |
| 8,474,626 | B2 * | 7/2013 | Chiu | H01L 21/67379 206/454 |
| 8,919,563 | B2 | 12/2014 | Gregerson et al. | |
| 2002/0015633 | A1 * | 2/2002 | Fosnight | G03F 7/7075 414/222.01 |
| 2003/0121870 | A1 * | 7/2003 | Beckhart | H01L 21/67383 211/41.18 |
| 2007/0183869 | A1 * | 8/2007 | Cho | H01L 21/67259 414/217 |
| 2007/0231110 | A1 * | 10/2007 | Akiyama | H01L 21/67379 414/217 |
| 2009/0087287 | A1 * | 4/2009 | Yu | H01L 21/67772 414/217.1 |
| 2009/0196714 | A1 | 8/2009 | Sylvestre et al. | |
| 2014/0011348 | A1 * | 1/2014 | Syue | H01L 21/02337 438/585 |
| 2014/0202921 | A1 * | 7/2014 | Babbs | H01L 21/67775 206/710 |
| 2018/0056291 | A1 * | 3/2018 | Bores | H01L 21/67373 |

\* cited by examiner

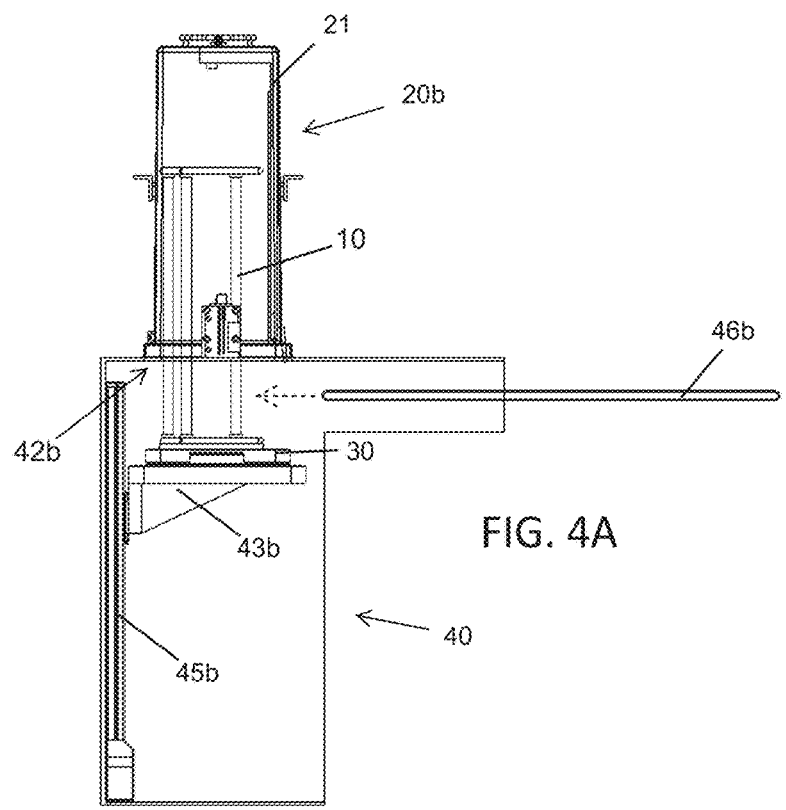
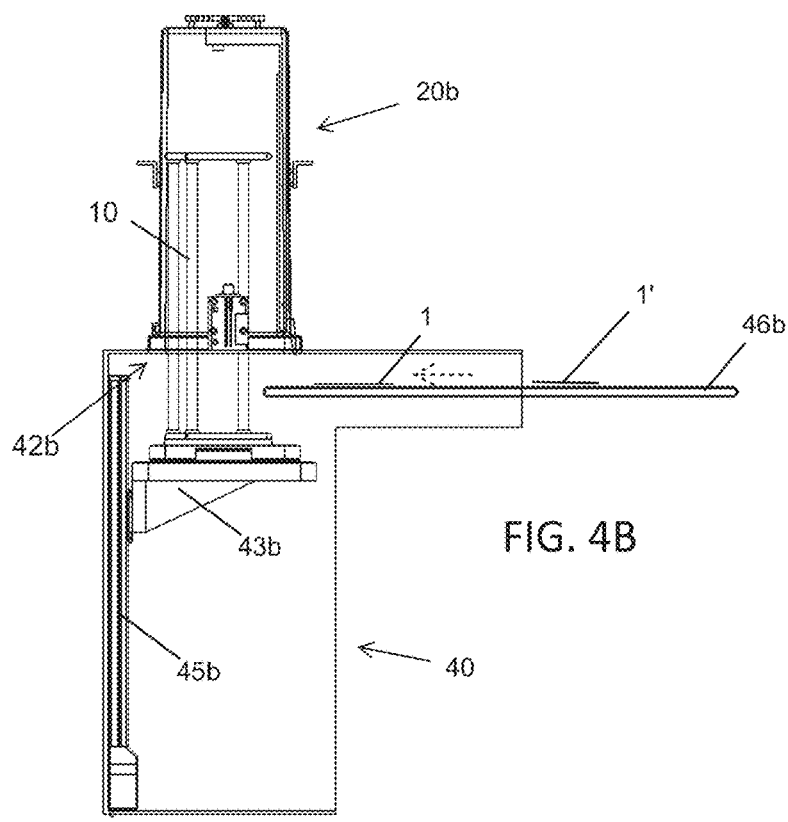

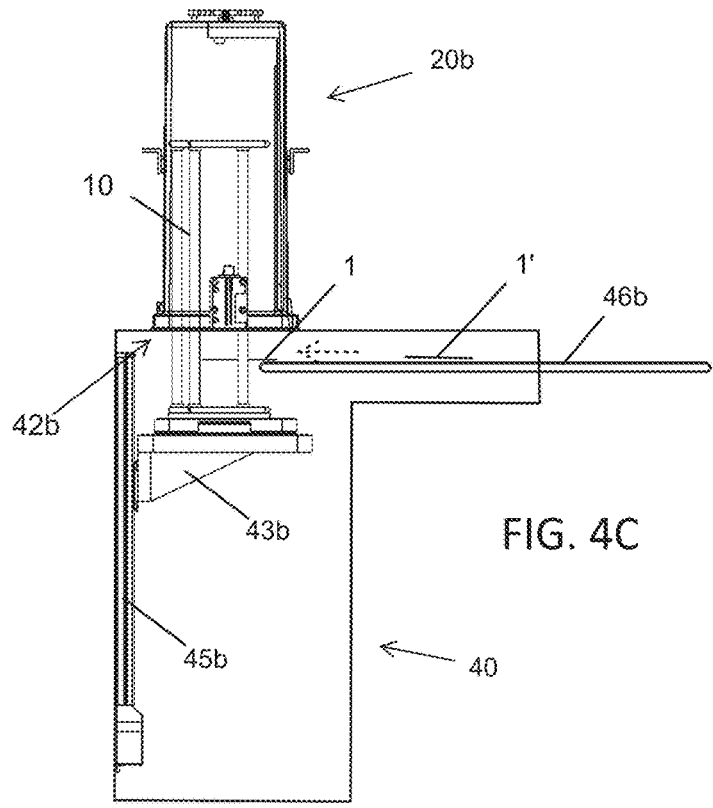
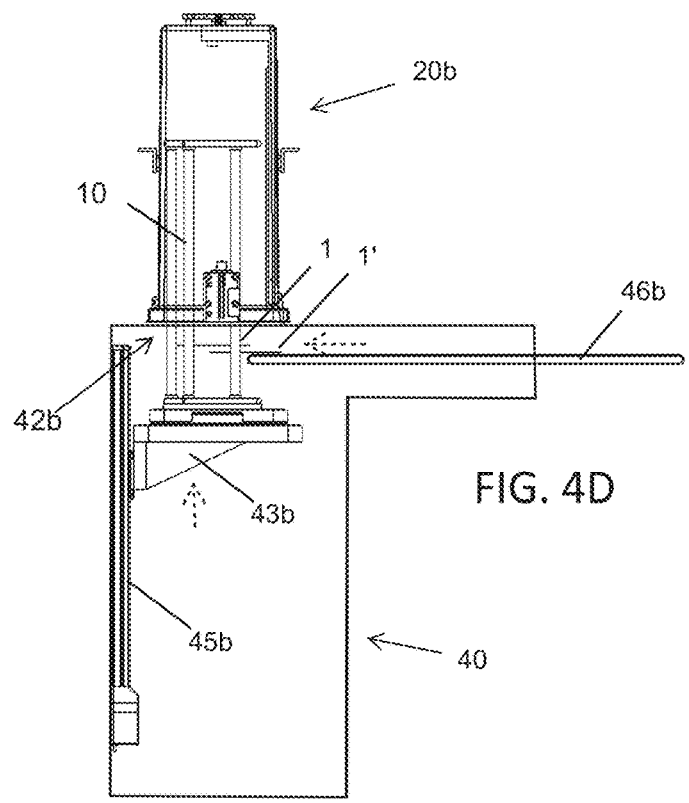

AMBIDEXTROUS CASSETTE AND METHODS OF USING SAME

CROSS REFERENCE TO RELATED APPLICATIONS

This claims the benefit of priority of U.S. Provisional Patent Application No. 62/267,274 filed on Dec. 14, 2015, the entire contents of which are incorporated herein by reference.

This is related to U.S. Non-Provisional patent application Ser. No. 14/985,284 and Ser. No. 14/985,294; each of which is filed concurrently herewith and incorporated herein by reference in its entirety.

FIELD OF THE INVENTION

This relates to devices, systems and methods that facilitate transfer and storage of solar cells. More specifically, this is related to cassettes adapted for carrying photovoltaic cells for use with a carrying pod that maintains a sealed protective micro-environment and allows automated transfer of solar cells in large-scale solar cell fabrication.

BACKGROUND

Advances in photovoltaic technology, and thus solar panels, have helped solar energy gain mass appeal among those wishing to reduce their carbon footprint and decrease their monthly energy costs. However, the panels are typically fabricated manually, which can be a time-consuming and error-prone process that makes it costly to mass-produce reliable solar panels.

Conventional approaches for fabricating solar cells often require the entire fabrication process for a particular solar cell to be performed with minimal delays between process steps since even brief exposure to ambient air triggers degradation of solar cell components by oxidation. If such delays are unavoidable, solar cell components are typically placed on a tray and stored in a large storage container that must be purged of ambient air and filled with an inert gas such as nitrogen. Even this approach, however, can result in some degradation of solar cell components since purging a large storage container can be time-consuming and studies have shown that measurable degradation occurs within 6 minutes of exposure to ambient environment.

In addition, since storage of solar cell components typically utilizes a high-grade of Nitrogen, such purging and filling of large storage containers can become cost prohibitive, thereby limiting the number of solar cells that can be efficiently transferred and stored without degradation occurring. These difficulties make large-scale production of solar cells challenging since large-scale production may require process steps to be performed at different times and/or locations necessitating delays between process steps. Therefore, it would be desirable to develop carriers and containers that provide storage of solar cell components while maintaining a protective micro-environment and that allow for quick and efficient transfer of solar cells to facilitate solar cell fabrication. It would be further desirable if such systems and methods allowed for transfer of large volumes of solar cells between locations in automated processes so as to facilitate large-scale production of solar cells.

BRIEF SUMMARY

In one aspect, the invention provides a solar cell carrying cassette adapted for use in a solar cell carrying pod. The cassette can include a pair of end plates having a plurality of rods extending therebetween so as to support the pair of end plates parallel to each other. The cassette can include a first interfacing feature and an identifier in each of the pair of end plates. The rods are configured to hold a stack of solar cells between the pair of end plates. The first interfacing feature in each of the pair of end plates is adapted for operably engaging with a mechanism in a base of the solar cell carrying pod that facilitates releasable coupling of the cassette with the base. The base is operable to facilitate sealing and attachment of the base with a cover of the solar cell carrying pod. Each identifier is adapted to allow for ready identification of the cassette or the stack of solar cells supported within when coupled within the pod.

In various embodiments, the solar cell carrying cassette includes an identifier disposed in each end plate on opposing sides of the cassette, which allows for ready identification of the cassette by either identifier from a single location relative the pod regardless of the orientation of the cassette within the pod. The identifier can be an RFID chip attached to each of the pair of end plates or any suitable means to allow for ready identification and/or tracking of cassette or stack of solar cells, particularly in an automated process. In various embodiments, the identifier on each end plates contains common identifying information so that the same identifying information is read regardless of which of the pair of end plates is coupled to the base. In any of the embodiments described within, the cassette is identifiable from either identifier without utilizing any other identifier on the cassette. The RFID chip can be embedded in an edge of each end plate so that the cassette can be identified by an RFID sensor positioned on a side of the cassette relative a front of the cassette for loading of the cassette. In various embodiments, the RFID chips can include a first RFID chip embedded in an edge of a first end plate on one side of the cassette and a second RFID chip embedded in an edge of the second plate on an opposite side of the cassette relative the front of the cassette such that at least one of the first and second RFID chips can be identified by an RFID sensor on one side of the cassette during processing regardless of which end plate is coupled with the base.

In various embodiments, the solar cell carrying cassette includes a pair of end plates and rods extending between end plates that include support features for supporting each of the plurality of solar cells supported within the cassette. The support features can include any of a recess, a protrusion, or any combination of a recess and protrusion. In various embodiments, the recess is defined as a notch such that each of the stack of solar cells rests on an interior surface of the notch when supported within the cassette. The support feature can be a protrusion defined as a shelf-like ledge support on which each of the solar cells rest when supported within the cassette. In other embodiments, the support feature can be defined as a reclined L-shape support configured so that each of the plurality of solar cells rests on an upwardly directed portion of the L-shaped support inward from an outer edge of the solar cell so as to avoid contact and/or stress with an outer edge of the each of the solar cells when supported within the cassette.

In various embodiments, the cassette includes a pair of end plates that each include a first interfacing feature for releasably coupling with a removable base of the solar cell carrying pod. The first interfacing feature can include a central hole dimensioned and positioned to be alternatively coupleable with the mechanism extending from the base or a protrusion extending inward from an upper portion of the cover opposite the base. Each end plate can further include a second interfacing feature in each of the pair of end plates adapted to align the cassette when coupled to the base. The second interfacing feature can include a plurality of holes distributed about the central hole in an arrangement to receive a plurality of pegs in at least one of the base and cover of the solar cell carrying pod. The plurality of rods can be arranged to define an front open side of the cassette to allow placement of solar cells within the plurality of rods for storage. The second interfacing feature being arranged to align the cassette with the front loading side of the pod to facilitate automated loading and unloading of solar cells.

In various embodiments, each of the pair of end plates of the cassette includes a third interfacing feature in each of the end plates. The third interfacing feature can include a pair of hooked notches along a front loading side of each end plate that are all oriented towards one side of the cassette relative the front side of the cassette such that the cassette is coupleable to the base in two different orientations. In various embodiments, the cassette has a left side and a right side relative the front loading side, the pair of end plates including a first and second end plate and the two orientations comprise a left-side orientation and a right-side orientation. In the left-side orientation, the pairs of hooked notches are oriented to the left side of the cassette when a first end plate is coupled to the base. In the second right-side orientation, the pairs of hooked notches are oriented towards the right side of the cassette when the second end plate is coupled to the base. The identifier can be disposed on each of the pair of end plates along opposite sides of the cassette so as to be identifiable from a single side of the cassette regardless of whether the cassette is coupled to the base in the left-side orientation or the right-side orientation.

In various embodiments, the cassette can further include a second interfacing feature in each of the pair of end plates for interfacing with corresponding features in an align mount or plenum of the cover or within the cover so as to facilitate alignment of the cassette within the pod during storage or charging of the pod with inert gas. The cassette can still further include a third feature on each of the pair of end plates to facilitate orienting and/or handling of the cassette during one or more subsequent processes before, during or after solar cell fabrication. The third features can include a hook-like notch in one side of each of the pair of end plates suited for use in various other process steps. The first, second and third interfacing feature may be configured as a coupling feature, alignment feature, handling feature or combinations thereof.

In another aspect, the invention provides a cassette adapted for carrying components formed in a semi-conductor fabrication process. The cassette can include a pair of end plates having a plurality of rods extending therebetween and configured to hold a stack of solar cells between the pair of end plates. One or more interfacing features can be included in each of the pair of end plates for operably engaging with an external mechanism for facilitating loading or unloading of the components from the carrier. An identifier is disposed on each of the pair of end plates, the identifier allowing for ready identification of the cassette and/or the stack of solar cells supported within the cassette. Typically, the identifiers are positioned on the pair of end plates so as to be identifiable from a single location relative the pod, on the left or right side of the pod, regardless of the orientation of the cassette within the pod. The identifier can be an RFID chip attached to each of the pair of end plates or any other suitable means for ready identification, particularly by an external sensor (e.g. RFID sensor, scanner). The identifier can be disposed on an edge of the end plate so as to be readable from a sensor disposed on one side of the pod as the pod passes by the sensor during handling and/or storage of the pod. The identifier on each end plate typically contains common identifying information such that the same identifying information is read regardless of which end plate is coupled to the base. The rods typically include support features for supporting the solar cells within, including but not limited to any of those support features described herein.

In yet another aspect, the invention provides A solar cell carrying cassette adapted for use in a solar cell carrying pod, the cassette including a pair of end plates with multiple rods extending between, one or more interfacing features in each of the pair of end plates and an identifier in each of the pair of end plates. The multiple rods support the pair of end plates parallel to each other and are configured to support a stack of solar cells therebetween. The rods are arranged to define an open front of the cassette through which the stack of solar cells are inserted and removed. The one or more interfacing features in each of the pair of end plates are configured for operably engaging with one or more corresponding features associated with a base of the solar cell carrying pod. The base is operable to sealingly couple with a cover of the solar cell carrying pod with the cassette coupled therebetween. The pair of end plates are configured so that the one or more interfacing features mirror one another relative a mid-plane between and parallel to the pair of end plates so that the cassette can be oriented with either of the pair of end plates coupled to the base. The identifier can be an RFID chip, barcode or other suitable means of identification. In various embodiments, the identifier is an RFID chip is disposed in each of the pair of end plates on opposite sides of the cassette so as to allow for ready identification of the cassette from a single location relative the pod, while the cassette is coupled within the pod, regardless of the orientation of the cassette within the pod.

BRIEF DESCRIPTION OF THE DRAWINGS

FIGS. 4A-4D illustrate sequential views of loading outgoing solar cells in a solar cell carrier of an attached solar cell carrying pod via coordinated movement of the elevator and an outgoing conveyor in accordance with various embodiments.

DETAILED DESCRIPTION OF THE INVENTION

The present invention seeks to ameliorate some, if not all, of the shortcomings of the prior art by use of an ambidextrous solar cell carrying cassette adapted for use in a solar cell carrying pod that maintains a micro-environment of inert gas and allows for quick and efficient transfer of solar cell components within a load lock solar cell transfer system. Advantageously, the solar cell carrying cassette includes corresponding interfacing features and identifiers in each end plate of the cassette. These features allow each cassette to be readily used, identified and tracked regardless of its orientation within the solar cell carrying pod or in subsequent processes thereby improving ease of use in transferring and storing large numbers of solar cells during large-scale fabrication.

Referring now to FIGS. 1A-12B, these figures illustrate various views of an exemplary solar cell carrier cassette and associated components adapted for use in a solar cell transfer system that facilitates automated transfer of solar cell components while maintaining a controlled environment.

Figure 1A:
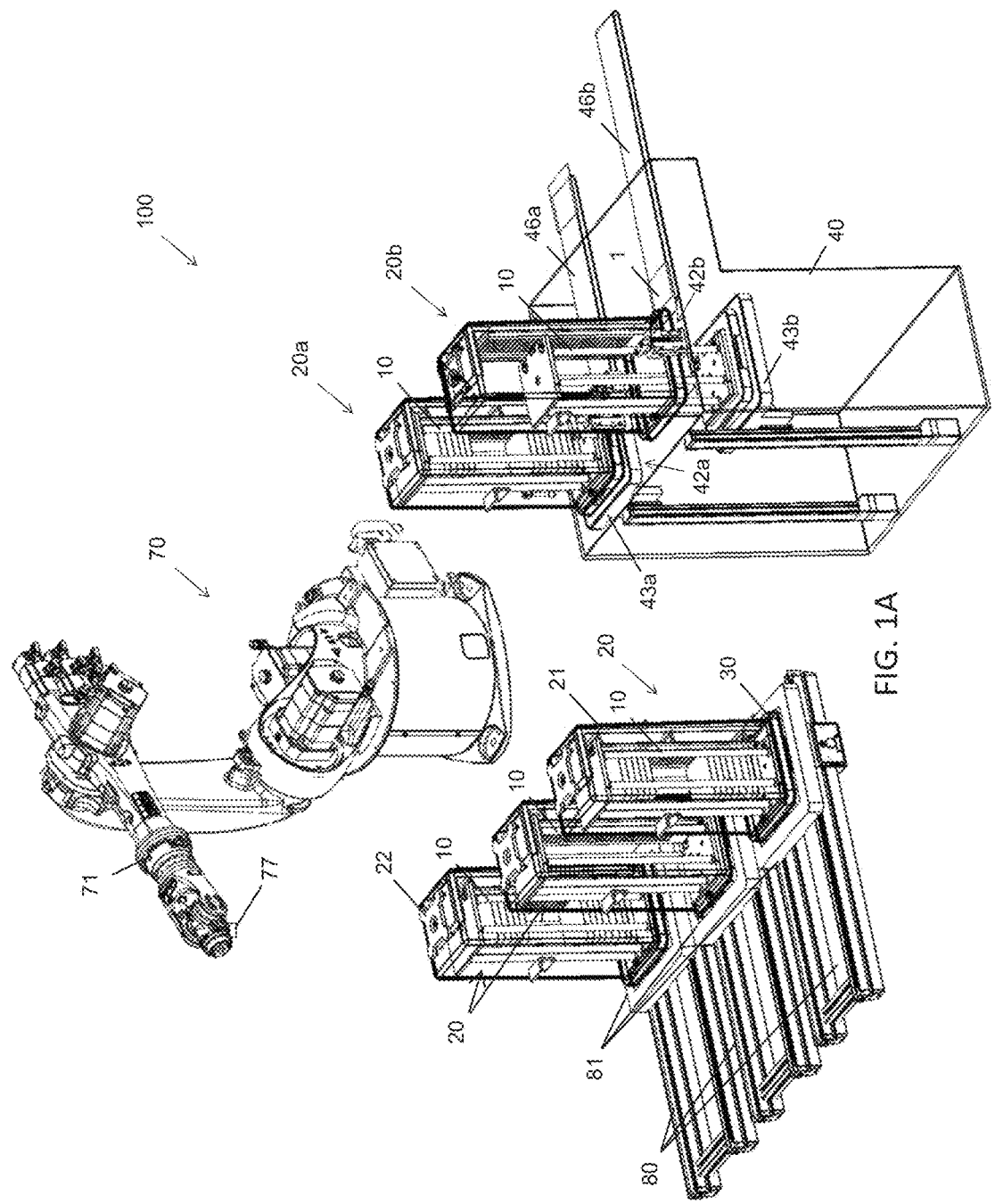
FIG. 1A illustrates a load lock solar cell transfer system for maintaining a controlled environment during transport of solar cells in accordance with various exemplary embodiments of the invention (housings of the solar cell carrying pod and tank receptacle are shown as transparent to better show internal components).

FIG. 1A shows an overview of an automated load lock solar cell transfer system 100. System 100 includes tank receptacle 40 having incoming conveyor 46a and outgoing conveyor 46b for conveying solar cells between a process flow tube (not shown) and one or more solar carrying pods 20 via the tank receptacle 40. Each of solar cell carrying pods 20 includes a cover 21 and a removable base 30 attached to a solar cell carrier cassette 10 adapted to hold a stack of solar cells or solar cell components. As can be understood further by reference to FIGS. 4A-4D, cassette 10 can be withdrawn into an interior of tank receptacle 40 through port 42b by elevator platform 43b on which solar cell carrying pod base 30 is coupled to facilitate loading and unloading of the respective cassette. Each solar cell carrying pod 20 maintains a microenvironment of inert gas (e.g. Nitrogen) to maintain the integrity of any solar cell components stored within. Since cassette 10 occupies a substantial majority of the internal cavity of solar cell carrying pod 20, the amount of the inert gas required to establish the microenvironment is minimized. Each solar cell carrying pod 20 can be disassembled, such as through a removable door, by a mechanism of tank receptacle that withdraws cassette 10 into tank receptacle 40 while maintaining a sealed microenvironment. Typically, one or more lip seals circumscribe ports 42 in tank receptacle 40 so as to sealingly engage with the bottom of cover 21 to maintain the microenvironment and minimize any loss of the inert gas. Typically, the seals are adapted to seal sufficiently tight to support a slight positive pressure so that the microenvironment can be more easily maintained and avoid any intrusion of ambient air.

In various embodiments, system 100 includes a control unit that coordinates movement of the conveyors 46a, 46b—both conveying movement and extending movement of the conveyors toward cassettes 10 withdrawn into the interior of tank receptacle 40. This process allows for loading of one or more solar cells from a conveyor to a cassette and/or unloading of one or more solar cells from cassette 10 onto a conveyor by coordinated movement between elevators and conveyors. In the embodiment shown here, tank receptacle 40 includes a pair of ports 42 to which a pair of solar cell carrying pods 20a, 20b are sealingly coupled for unloading incoming solar cells and outgoing port for loading outgoing solar cells.

Figure 1B:
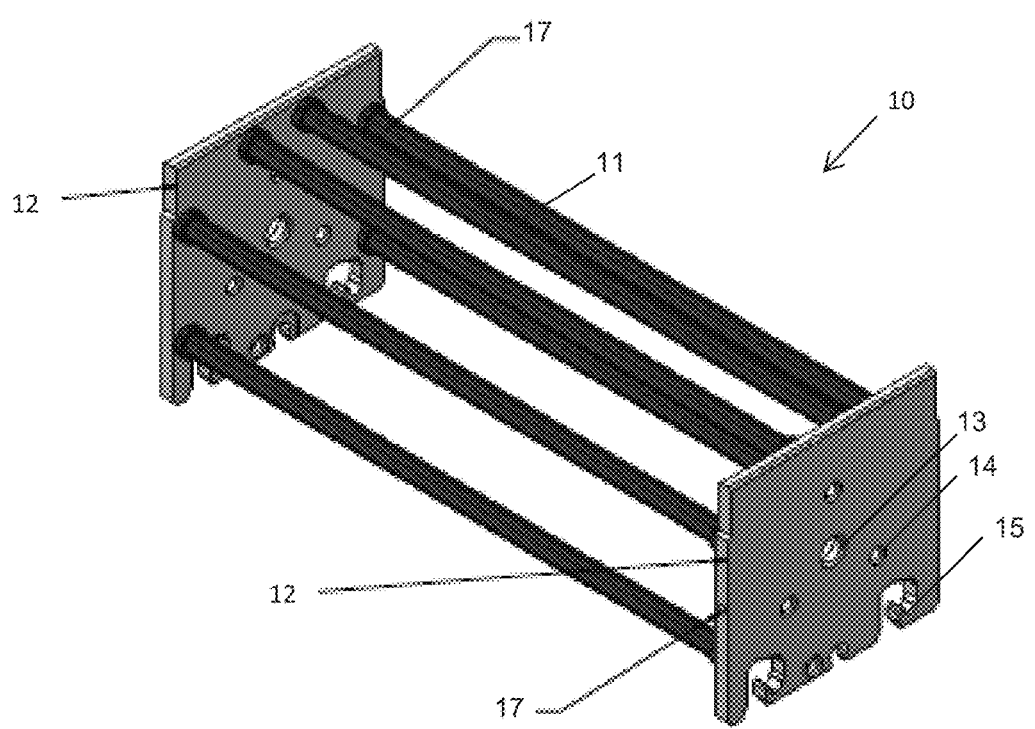
FIG. 1B illustrates an ambidextrous carrier cassette adapted for use with the load lock system of FIG. 1A in accordance with various embodiments.

As shown in FIG. 1A, solar cell carrying pod 20a contains cassette 10 loaded with incoming solar cells that are mounted to the incoming port for unloading of solar cells onto incoming conveyor 46a for conveyance into the process flow within the tube attached to tank receptacle 40. Solar cell carrying pod 20b is mounted on the outgoing port of tank receptacle and its cassette 10 is withdrawn into tank receptacle to facilitate loading of outgoing solar cells into cassette 10 by coordinated movement of respective elevator platform 43b and outgoing conveyor 46b. As shown in FIG. 1B, each carrier cassette 10 can include an identifier 17 suitable for automated identification. In this embodiment, identifier 17 is an RFID chip, disposed in each end of cassette 10 so as to allow for detection from an identification sensor, such as an RFID sensor, that can be positioned on or adjacent the tank carrier or along the robotic arm.

As shown at left in FIG. 1A, staging tracks 80 are used for staging of the solar cell carrying pods to facilitate large-scale loading and unloading of outgoing and incoming solar cells from multiple solar cell carrying pods by use of an automated robotic arm assembly 70 to facilitate repeated cycling of full and empty solar cell carrying pods. Solar cell carrying pods 20 may be supported on pallets 81 having a recess or molded portion for supporting a pod base in a particular position and/or orientation. Pallet 81 can be formed with a similar recess or molded feature as that shown on the elevator platforms 43 so as to fittingly receive an underside of each of solar cell carrying pods 20. Each of staging racks 80 can be configured so that pallets 81 readily slide, or are automatically conveyed to a particular position so that the robotic arm can process multiple solar cell carrying pods for loading and/or unloading by repeating a pick-up or drop-off operation at the same position along the respective staging track.

Each staging rack may be designated for a particular purpose so as to be amenable to automation for large-scale solar cell transfer. In this embodiment, the furthest left staging track 80 carries one or more solar cell carryings pods 20 with cassettes loaded with incoming solar cells so that each pod can be picked up, in turn, by robotic arm and attached to the incoming port 42*a* of receptacle tank 40 for unloading of incoming solar cells. After unloading, the empty cassette 10 can be raised into the respective solar cell carrying pod and sealed, after which the empty pod can be placed by the robotic arm onto far right staging track 80. Any empty solar cell carrying pods on the middle staging track 80 can be picked-up by robotic arm 71 of an automated robotic system 70 and positioned onto and attached to outgoing port 42*b* on receptacle tank 40 for loading of outgoing solar cells. The process by which solar cells are loaded and unloaded from solar cell carrying pods 20 mounted on respective ports 42*a*, 42*b* is detailed in FIGS. 4A-4D, described further below. After outgoing solar cells received from the process flow tube are conveyed and loaded into the cassette 10 of solar cell carrying pod 20*b*, the full or partially full cassette 10 is raised into the pod by elevator 43*b* and sealed, then placed by robotic arm system 70 onto staging track 80. Full or empty pods can be removed from or placed on any of staging tracks, as needed, for storage or transfer of incoming or outgoing solar cells, either manually or by various other automated processes. The above described process is advantageous as it allows for repeated transfer of incoming solar cells and outgoing solar cells between numerous solar cell carrying pods and the process flow tube as needed for large scale solar cell fabrication. While dedicated incoming and outgoing ports and conveyers are utilized here to facilitate large scale transfers of solar cells, it is appreciated, however, that these concepts can be used alternatively to facilitate loading and unloading of outgoing and incoming solar cells with a single port.

As shown in FIG. 1B, solar cell carrying cassette 10 includes a pair of end plates 12 with a plurality of rods 11 extending therebetween and configured for supporting a stack of solar cell components therein. Each end plate includes one or more interfacing features that can be used to couple, orient and/or handle the cassette. In this embodiment, each end plate includes one or more coupling features 13 that facilitate coupling of cassette 10 within solar cell carrying pod 10. Couplings features 13 may include one or more shaped openings, typically circular in shape, that interface with a corresponding features within the interior of solar cell carrying pod so as to secure the cassette within solar cell carrying pod 20. In this embodiment, coupling feature 13 is a circular opening near a center of each end plate 20.

Each end plate 12 can further include one or more alignment features 14 that facilitate orientation (e.g. rotational orientation relative to a longitudinal axis of casette) by interfacing with one or more corresponding features within solar cell carrying pod 20 or in a subsequent process. Alignment features 14 can be defined as multiple openings in a particular arrangement so as to ensure cassette 10 is secured in a particular orientation within pod 20. For example, in this embodiment, rods 11 are typically arranged in pairs and extend between end plates 12 on three sides, except a front edge of each end plate 12, leaving a front side of cassette 10 open for loading and unloading of solar cells from between rods 10. When alignment features 14, defined here as a group of three offset holes, that are interfaced with corresponding protrusions in base 30 or upper plenum 29, for example peg 30*a* in base 30 and peg 29*a* in upper plenum 29 inside solar cell carrying pod 20 shown in FIGS. 6B-6C. Cassette 10 is oriented so that the fourth open side is oriented towards the conveyors when elevator 43 is lowered for loading or unloading of solar cells within cassette 10. In various embodiments, coupling features 13 and/or alignments features are arranged in corresponding positions on each end plate 12 so that regardless of which end plate 12 is coupled to base 30 of solar cell carrying pod 20, cassette 10 operates in the same manner.

Each of end plates 12 can further include handling features 15 to faciliate handling of casettes 10 (e.g. lateral positioning, transport, suspension of cassettes for cleaning, or handling in various other processes). In this embodiment, handling features 15 are defined as hook-shape recesses along the front edge of each end plate 12. These features, unlike coupling feature 12, define a particular orientation, such as a left-sided or right-sided orientation, in which the handling features 15 both hook towards the same side of cassette 10. While the orientations of the handling features 15 may be useful in certain other processes, in various embodiments, cassette 10 can be attached to base 30 within solar cell carrying pod 20 in either orientation (e.g. left-side end plate 12*a* or right-side end plate 12*b* coupled to base 30).

Figure 1C:
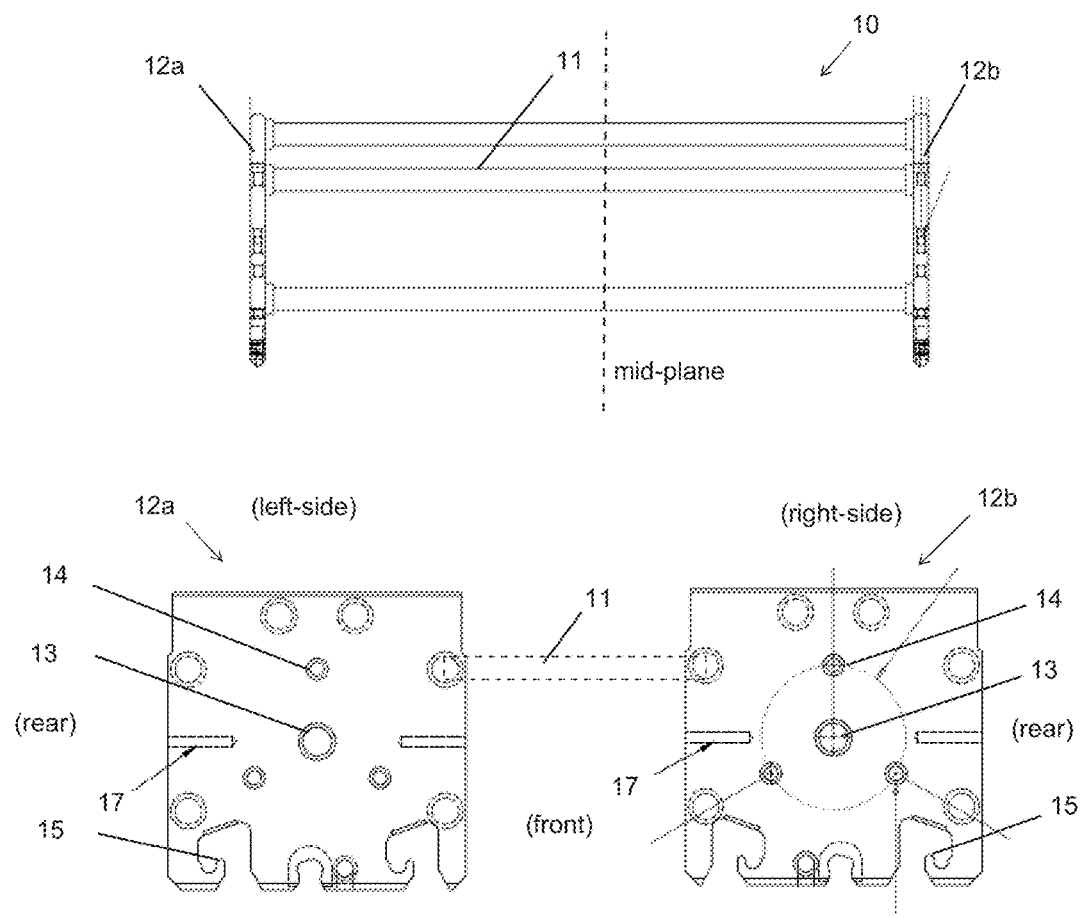
FIG. 1C illustrates detail views of the ambidextrous carrier cassette of FIG. 1A in accordance with various embodiments.

FIG. 1C shows detailed side and end views of cassette 10 shown in FIG. 1B. In regard to the coupling features described above, end plates 12 are mirror images of one another such that cassette 10 is reversible—that is, the coupling features in either end plates 12 can interface with corresponding features within the base while rods 11 extending between end plates 12 defines an open front of cassette 10 to facilitate loading/unloading of solar cells within cassette 10. Cassette 10 further includes an identifier in each end plate 12, but unlike the various other features (e.g. coupling, alignment and handling features described above), the identifier 17 in each end plate are disposed on different sides. For example, a first identifier 17 is disposed on the rear facing edge of the left-side end plate 12*a* and a second identifier 17 is disposed on the front facing edge of the right-side end plate 12*b* with respect to the view in FIG. 1C. This arrangement is such that regardless of the orientation of cassette 10 within the solar cell carrying pod (e.g. left-side coupled to base or right-side coupled to base), identifier 17 in the respective end-plate passes by a set location to allow ready identification of cassette 10 by a single identification sensor. For example, RFID sensor 47 adjacent the port in tank receptacle 40 or RFID sensor 77 on robotic arm 71, as shown in FIG. 1A, would pass by at least one identifier 17 of one end-plate during the transfer procedures described herein.

In this regard, cassette 10 is considered to be ambidextrous, such the cassette can be identified regardless of whether the cassette is in a left-side or right-side end plate orientation within the solar cell carrying pod. Such a configuration is advantageous as it allows each carrier 10 to be identified and tracked by a sensor disposed in a single location adjacent solar cell carrying pod 20 regardles of which of the pair of end plates 12 is coupled to base 30 of solar cell carrying pod 20. This is also useful at other stages during solar cell fabrication that may necessitate flipping of the cassette as needed for various processes. Along similar lines, pair of end plates 12 can include various other corresponding features that are substantially identical, for example alignment or coupling features 13, 14 suited for use with solar cell carrying pod 20 or various other mechanisms in subsequent processes. Use of RFID chips as identifier 17 in each end plate is particularly useful as it allows casette 10 to be readily identified by a sensor in close proximity, even when disposed within solar cell carrying pod 20. It is appreciated that identifiers 17 are not limited to RFID chips and could include any suitable means for identification (e.g. numbers, barcodes, etc.). It is further appreciated that this carrier cassette configuration is not limited to solar cell fabrication and can provide similar advantages when used in carrying various other components associated with semiconductor fabricated products.

Figure 2:
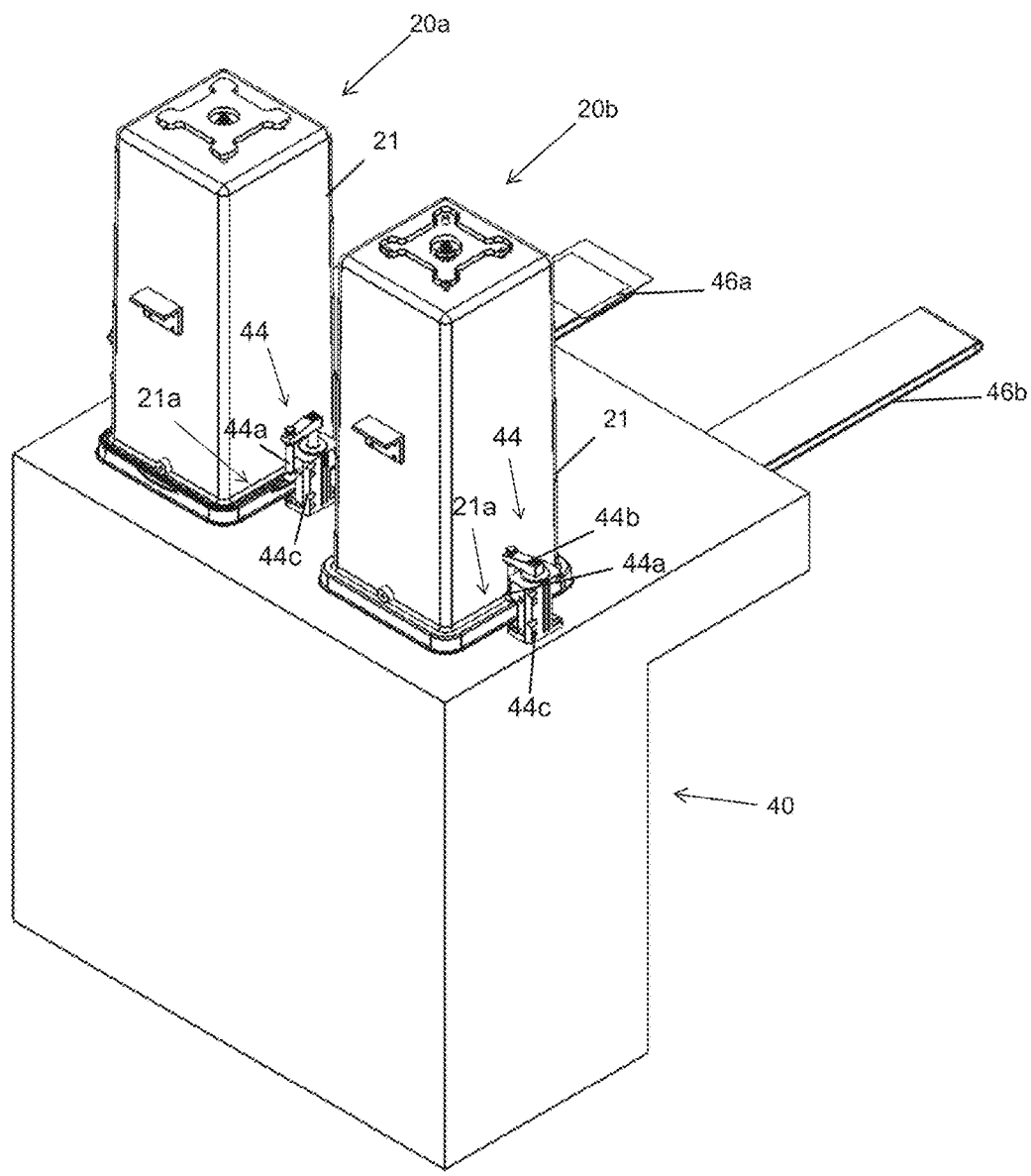
FIG. 2 illustrates a tank receptacle attached to both an incoming solar cell carrying pod and an outgoing solar cell carrying pod to facilitate transport of solar cells from the processing tube via incoming and outgoing conveyers in accordance with various exemplary embodiments of the invention.
Figure 3A:
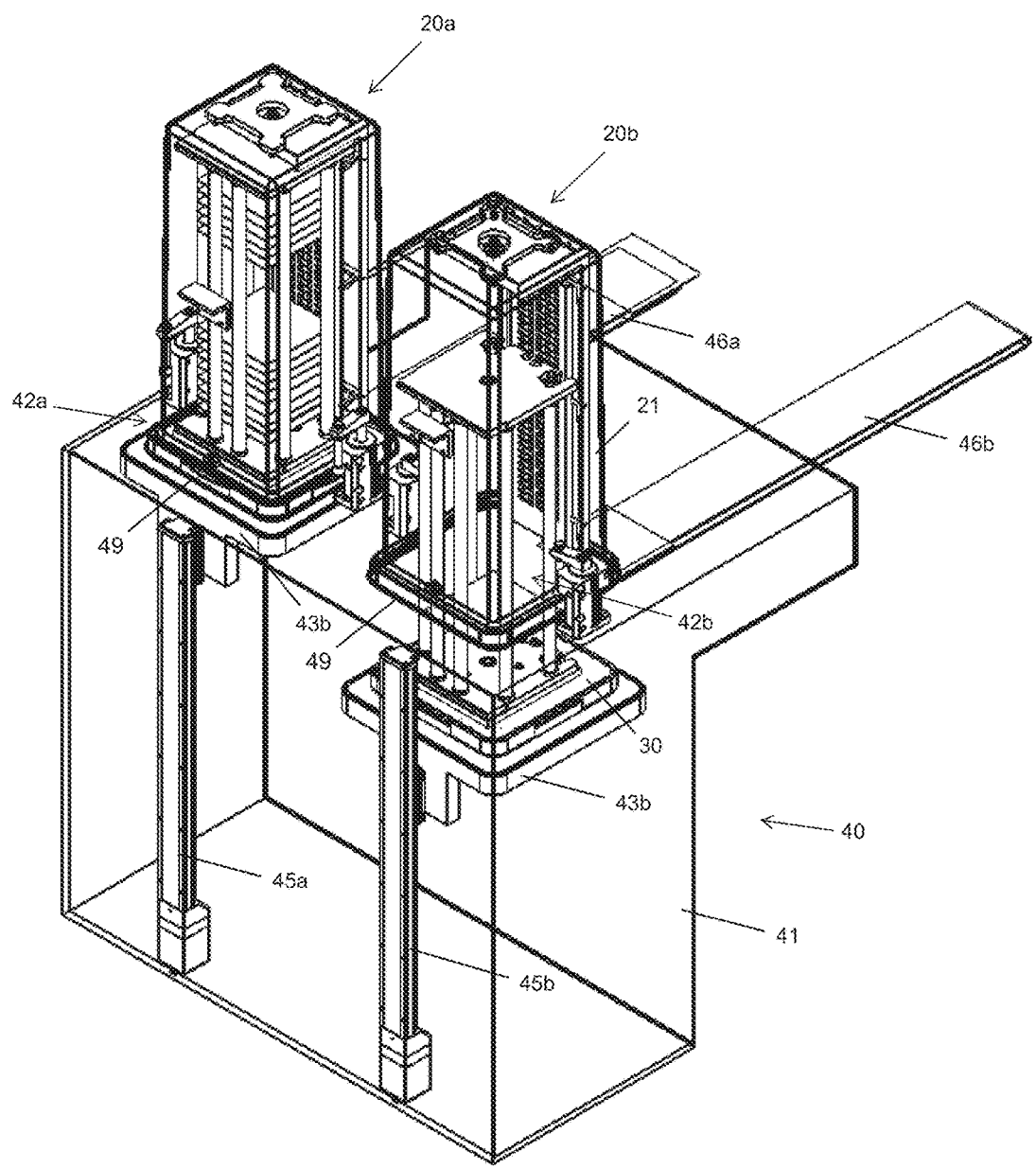
FIGS. 3A-3B illustrate various views of the tank receptacle and attached solar cell carrying pods of FIG. 2A (housings of tank receptacle pods are shown as transparent).
Figure 3B:
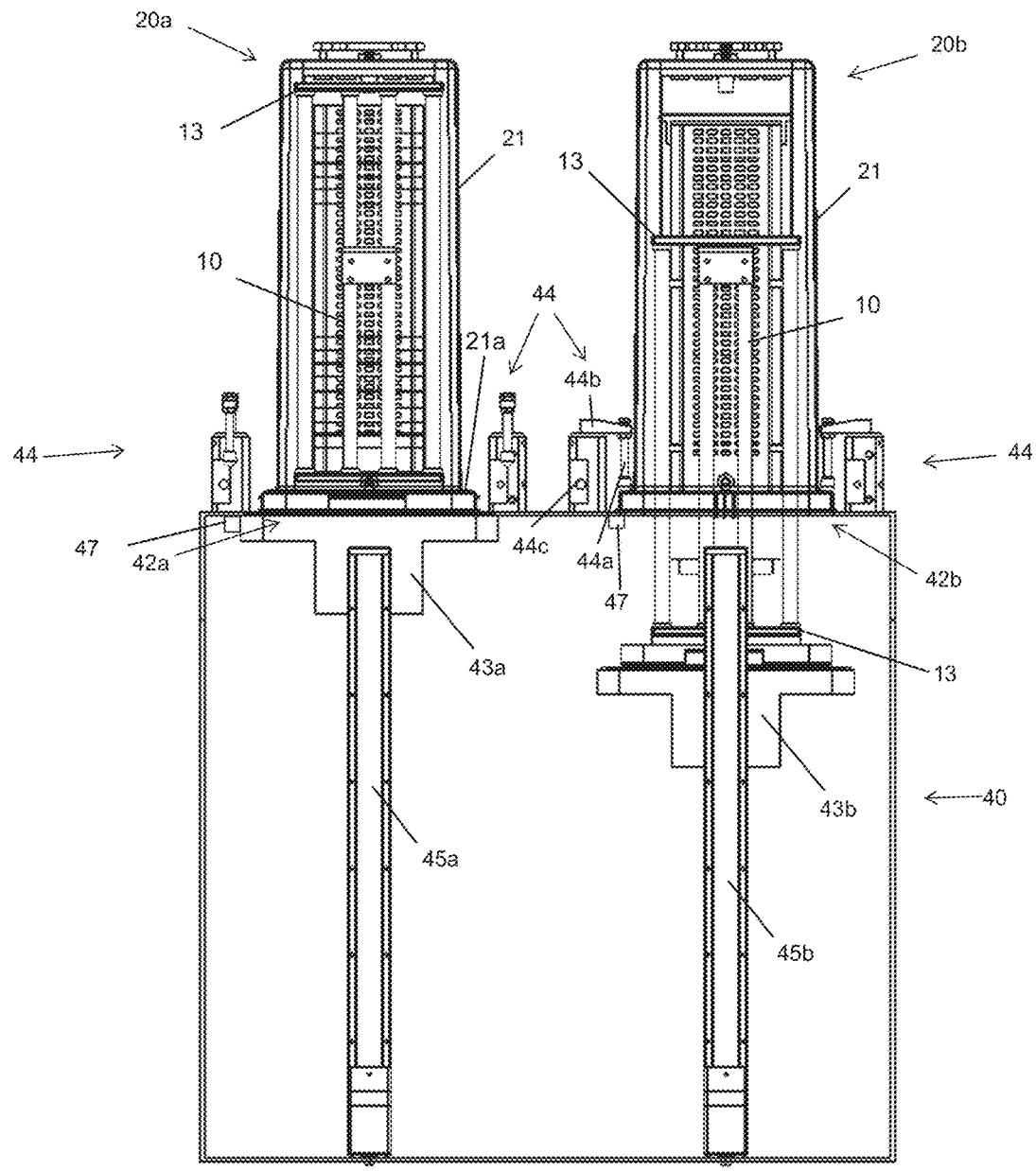

As shown in FIGS. 2 and 3A-3B, tank receptacle 40 includes a pair of clamping mechanisms 44 on each side of the incoming and outgoing ports 42a, 42b by which each respective solar cell carrying pod 20a, 20 are shown sealingly coupled. The system can include one or more sensors (not shown), such as a pressure sensor, RFID detector, or proximity sensor, to determine when the solar cell carrying pod is properly positioned over a respective port 42.

In the embodiments shown in FIG. 3B, each clamping mechanism 44 includes sealing finger 44a, extending from a pivoting arm 44b, that is rotated by a base 44c mounted on the top of receptacle tank 40. A distal tip of sealing finger 44a pressingly engages against an outer surface of an outer bottom edge of the solar cell carrying pod cover so as to provide sufficient force to sealingly engage a bottom edge of the solar cell carrying pod cover with the top surface of receptacle tank surrounding the port opening. Typically, as shown in FIG. 3A, one or more lip seals 49 circumscribe each of the pair of ports 42a, 42b so as to provide an air-tight seal between cover 21 and the housing 41 of tank receptacle 40, even under a positive pressure within the receptacle tank and pod. In this embodiment, as shown in FIGS. 2 and 3B, the bottom edge of the pod cover includes a ramped or sloped bottom ridge 21 that sealing finger 44b pressingly engages in the clamped configuration. The distal end of sealing finger 44a can be pivoted by rotating pivoting arm 44b and then lowering pivoting arm 44b to engage the bottom ridge 21a of pod cover 21 with sealing finger 44a. In various embodiments, pod cover can be sealed by rotation of sealing finger 44a into engagement with bottom ridge 21a. The distal tip of sealing finger 44a may be defined in a bulbous shape to facilitate sliding and/or engagement with the outer surface of the pod. Sealing finger 44a can also be provided with a tip formed of a softened material, such as rubber or silicone, to further facilitate sliding and engagement with the pod.

As shown in FIGS. 2 and 3B, clamping mechanism 44c can include a motor actuator, such as a servo motor, to effect pivoting movement of arm 44b so as to pressingly engage sealing finger 44a against the bottom ridge 21a of cover 21. The motor can be coupled with a controller that pivots sealing finger 44a towards pod 20 in response to an output from a sensor (e.g. pressure, RFID detection) that indicates the presence of the pod placed over port 42. While the clamping mechanisms in this embodiment utilize a downward facing finger that swings laterally and lowers into place, it is appreciated that the clamping mechanism can be configured seal by merely rotating, lowering or sliding into position or can be configured to utilize various other sealing mechanisms to apply a downwardly directed force against the pod cover sufficient for sealing.

As shown in FIG. 3B, once the solar cell carrying pod cover is sealingly coupled to the receptacle tank 40 over a respective port, elevator platform 43b couples with base 30 of the respective solar cell carrying pod and then effects detachment of base 30 from the respective solar cell carrying pod cover 21. Elevator 43b then lowers along track 45b thereby withdrawing pod base 30 along with attached cassette 10 into the interior of tank receptacle 40, as shown in FIG. 3B. Once in a desired position, loading and unloading of solar cells or solar cell components within cassette 10 is facilitated by coordinated movement of the elevator platform and the conveyor along which the solar cell components are conveyed. An example of such coordinated movement used in loading outgoing solar cells is shown in FIGS. 4A-4D.

In FIG. 4A, solar cell carrying pod 20b including an empty cassette 10 for loading of outgoing solar cells has been sealed over the outgoing port 42b of tank receptacle 40 and pod base 30 has been coupled to elevator platform 43b, detached from cover 21 and withdrawn so that cassette 10 is partly within the interior of tank receptacle 40. Solar cells can be positioned along a number of different shelves defined by support features in the rods of the cassette 10 (see FIGS. 11A-11C). Typically, cassette 10 is lowered until the top surface of the conveyor is at about the level of the top-most shelf of the cassette 10 at which an outgoing solar cell can be loaded in order to allow cassette 10 to be complete filled; however, cassette 10 can be lowered to any desired position in order to access various differing levels or shelves or to only partly fill the cassette 10 if desired. For example in FIG. 4A, cassette 10 is shown only lowered to about one-third the total depth. Once cassette 10 is lowered into a desired position suitable for loading of outgoing solar cells therein, outgoing conveyor 46 is extended towards cassette 10. The conveyor can be extended to a position near the edge of the front opening defined by the rods of the cassette 10, as shown in FIG. 4B, or until the distal edge of the conveyor is within an interior space of cassette 10. Once positioned as desired, outgoing solar cells are conveyed along outgoing conveyor 46b until the distal most solar cell 1 reaches its destination within a respective shelf of cassette 10, as shown in FIG. 4C. When loading solar cells, once a solar cell has been conveyed and slid into a storage shelf position defined between rods of cassette 10, the elevator platform 43b raises cassette 10 upwards so that a subsequent solar cell 1' on the conveyor can be slid into the next lower shelf position in cassette 10, as shown in FIG. 4D. This sequence of coordinated movement can be repeated until the cassette is filled with solar cells.

The process of unloading a filled cassette 10 from solar cell carrying pod 20a filled with incoming solar cells can be accomplished by merely performing the above described steps in reverse, that is unloading from the bottom up. In an example of such an unloading process, a solar cell within cassette 10 of pod 20a is engaged by incoming conveyor 46a until the solar cell is slid out of its position within cassette 10 and then conveyed on the incoming conveyor towards the process flow tube. Elevator platform 43a then moves downward until a bottom of the next solar cell upwardly adjacent solar cell is lowered to a level of incoming conveyer 46a for removal and transferred into the process flow tube via conveyor 46a. This approach of utilizing coordinated movement of conveyors and elevator platforms is advantageous as it allows for loading and unloading of the solar cell components along a common plane, which may be the same as the plane of solar cells being transported within the process flow tube. Thus, the transfer system can be incorporated into an assembly-line type process flow such that the solar cells can remain at about the same elevation when not stored within the cassette of a respective solar cell carrying pod.

Figure 5A:
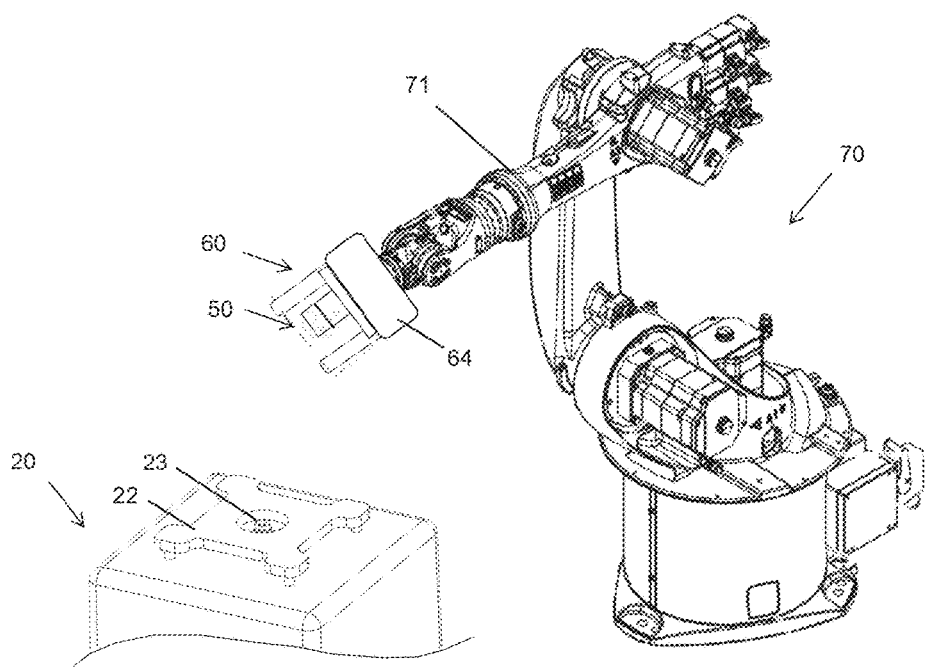
FIGS. 5A-5C illustrate a robotic arm of the system and associated gripper and nozzle mechanism for facilitating transport of the solar cell carrying pod and control of a microenvironment within each solar cell carrying pod in accordance with various embodiments.

In another aspect, transfer of solar cell carrying pods 20 between staging racks 80 and the incoming and outgoing ports 42a, 42b of tank receptacle 40 can be performed automatically by robotic arm 71, as shown in FIG. 1A, which allows the above described process of unloading and loading to be performed repeatedly using a large number of solar cell carrying pods. To allow for transport of a respective pod by robotic arm 71, each solar cell carrying pod 20 includes a top handle 22 adapted for use with a gripper 60 on a distal end of a robotic arm 71, as shown in FIG. 5A. Gripper 60 is adapted to releasably couple with top handle 22 of a respective solar cell carrying pod 20 for transport from staging racks 80 to a port 42 of receptacle 40, or vice versa.

Figure 5B:
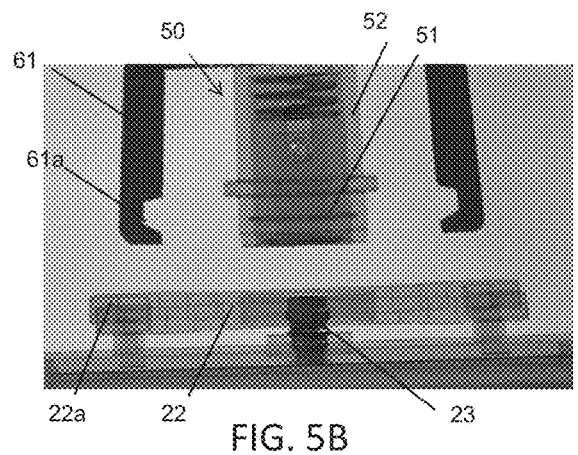
Figure 5C:
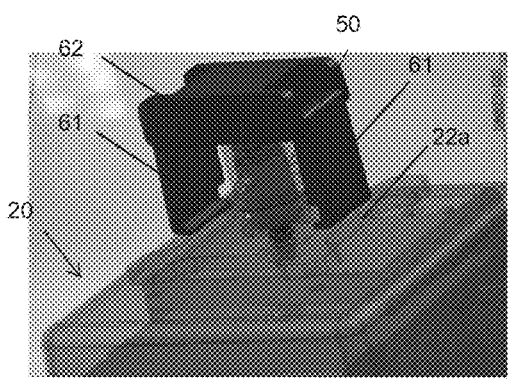

FIGS. 5A-5C further illustrate gripper 60 on robotic arm 71. In this embodiment, gripper 60 is defined by a pair of movable grasping jaws 61 extending from a common base 62 attached to robotic arm 71 and top handle 22 is defined by a plate securely coupled to and spaced away from the top surface of the pod cover to allow the handle 22 to be grasped by a pair of movable grasping jaws 61 of gripper 60. Grasping jaws 61 are moveable between an open position for receiving top handle 22 and a closed position for grasping top handle 22 between gripper jaws 61. Movement of grasping jaws 61 between open and closed positions is effected by a gripper actuation mechanism, which as shown in the embodiment of FIG. 5A, can include sleeve 64 that is movable distally so as to force gripper jaws 61 towards one another after top handle 22 is positioned therebetween. In this embodiment, gripper jaws 61 are biased laterally outward from one another, such as by a spring 63 or other biasing mechanism, so as to receive top handle 22 therebetween and are forced together by distal movement of sleeve 64, which be air-actuated by a pneumatic actuation. While an air-actuated gripper actuation mechanism is described here, it is appreciated that the gripper may utilize any suitable mechanism for effecting movement of a gripper jaws between an open and closed position, for example, a cable driven or lead screw driven mechanism, or an actuatable magnet. In one such example, an electro-magnet can be positioned to close gripper jaws 61 by magnetic force when activated, such that gripper jaws can be readily moved between open and closed positions by selective activation of the magnet. In another embodiment, the system may use an electro-magnet that releasably couples to the top handle or another portion of the pod with enough magnetic force to lift the solar cell carrying pod without use of any gripper jaws.

In another aspect, a nozzle assembly 50 is provided to allow for automated charging of a solar cell carrying pod with inert gas, such as Nitrogen. In this embodiment, the nozzle assembly is incorporated into gripper 60 such that the solar cell carrying pod can be charged with nozzle assembly 50 while being transported with gripper 60. Nozzle assembly 50 includes a nozzle 51 within a nozzle housing having a biasing member, a retention ring and an O-ring seal that provides sealing engagement of nozzle 51 with valve 23 at top of pod 20 to allow charging of pod 20 with inert gas to establish or maintain a micro-environment of inert gas within pod 20. Because nozzle assembly 50 is disposed within gripper 60, as gripper 60 is positioned over top handle 22, nozzle housing 52 extends through a center hole in the plate of top handle 22 until a boss abuts against the top surface of top handle 22 and nozzle 51.

In another aspect, each of grasping jaws 61 and top handle 22 can include corresponding features to facilitate interfacing between the components. In this embodiment, grasping jaws 61 include a recessed portion or groove 61a that receives an edge of top plate 22 within a recessed grasping region 22a dimensioned to correspond to the width of grasping jaw 61. These features allow each solar cell carrying pod 20 to reliably couple with gripper 60 of robotic arm 71 in a controlled and predictable position and/or orientation so as to facilitate controlled positioning of each respective solar cell carrying pod on a desired port of the receptacle tank 40 such that the position of cassette 10 within a respective solar cell pod 20 is precisely controlled.

Figure 6A:
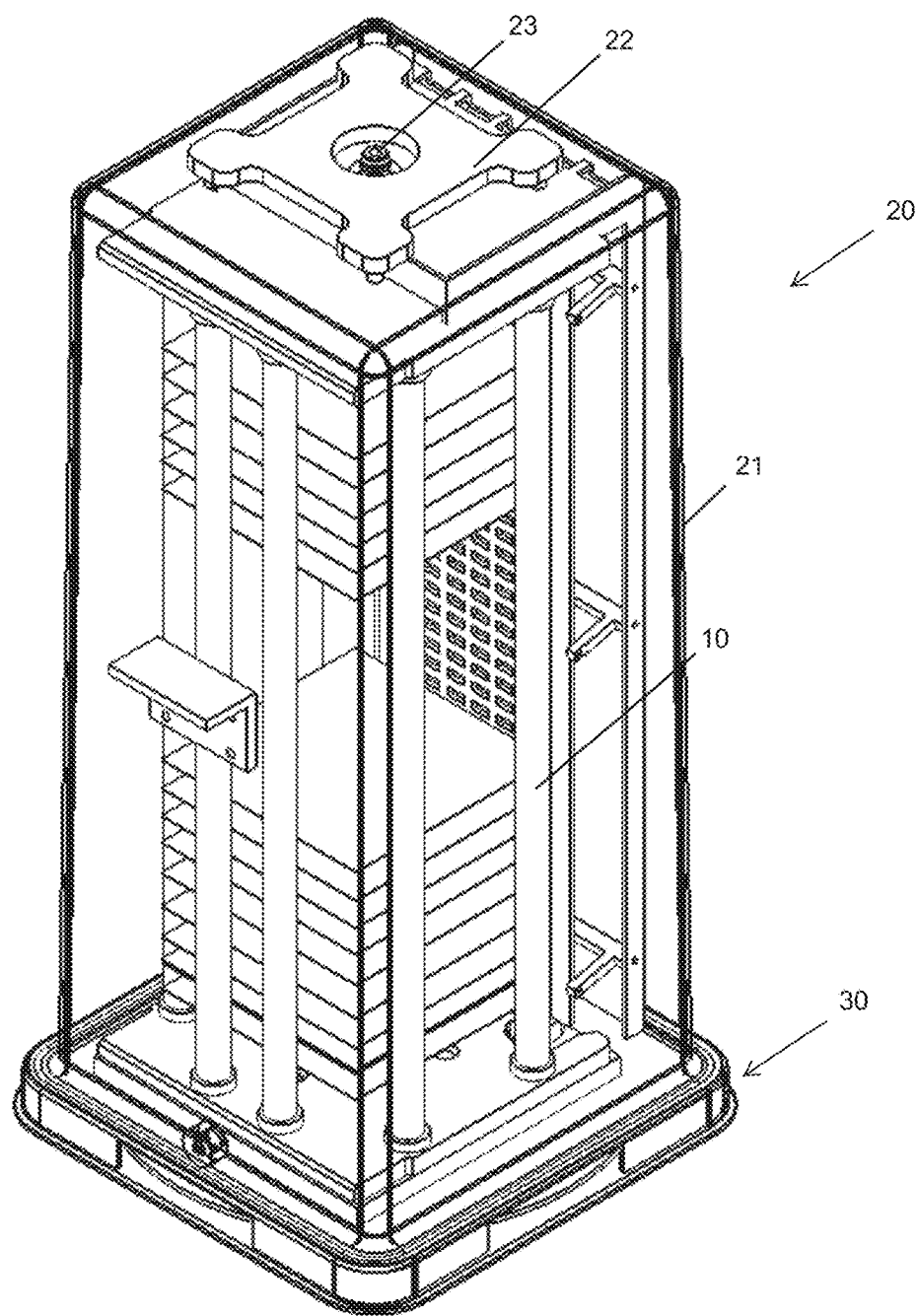
FIGS. 6A-6C illustrates various views of the solar cell carrying pod in FIG. 10A with the cover housing shown transparent.
Figures 6B, 6C:
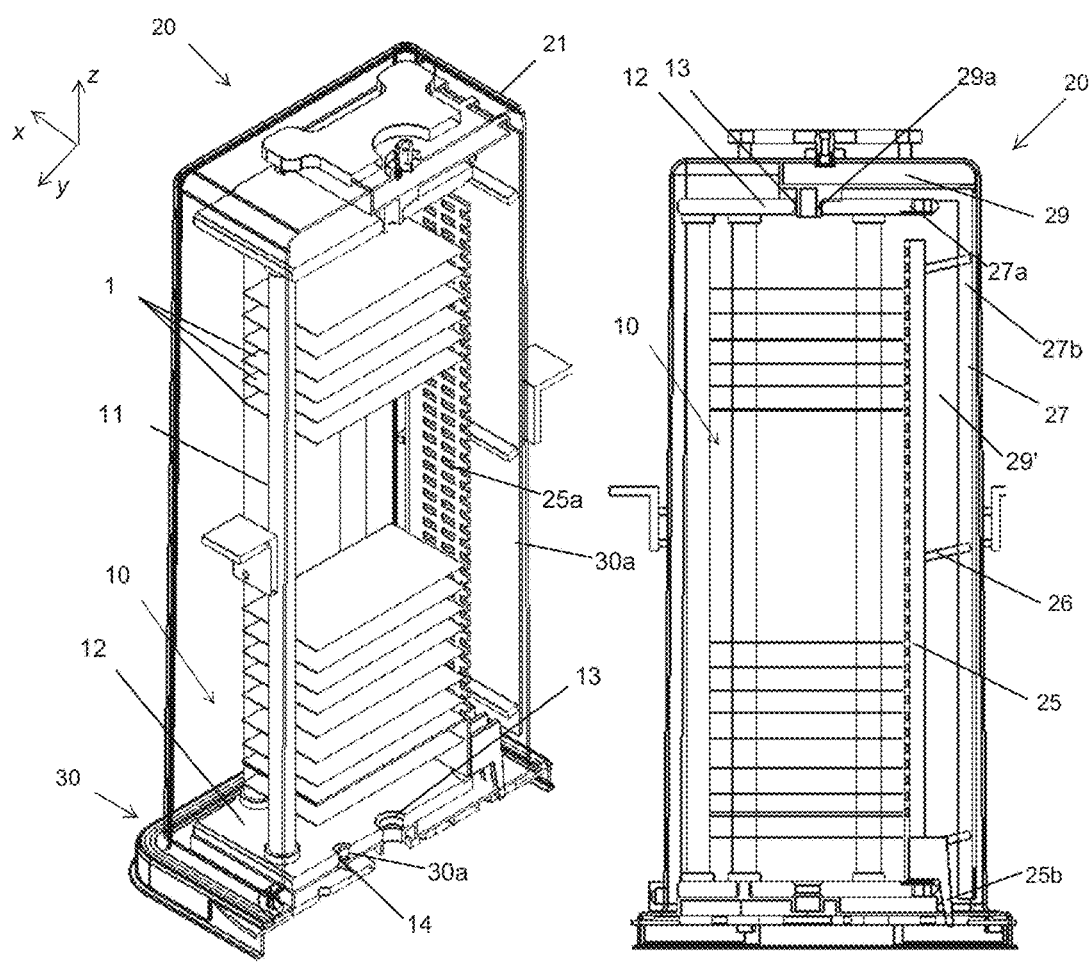
Figure 7A:
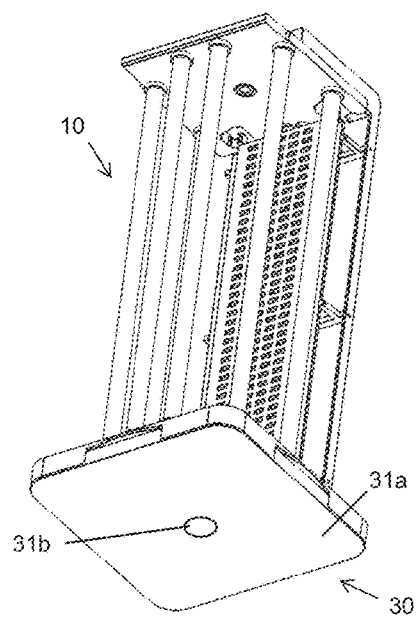
FIGS. 7A-7B illustrate a bottom view and an exploded bottom view, respectively, of a gear system in a pod base for effecting locking and release of the removable base with the cover of the solar cell carrying pod in accordance with various embodiments.
Figure 7B:
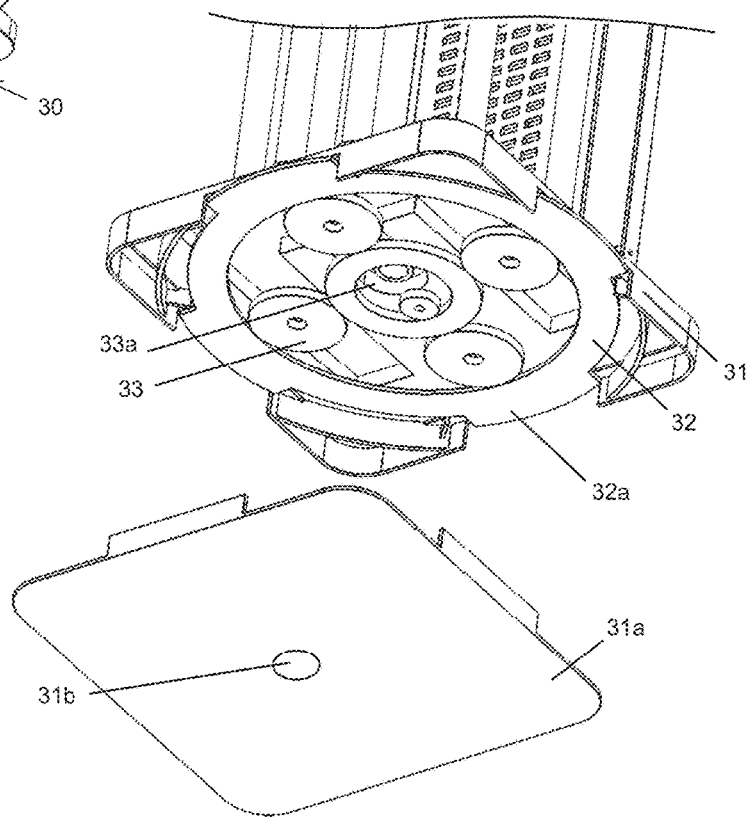

FIGS. 6A-6C and 7A-7B show additional detail views of solar cell carrying pod 20 having a carrier cassette 10 adapted for use with the load lock solar cell transfer system described herein. As shown in FIG. 7A, a base cover 31a can fit over the underside of pod base 30 Base cover 31a fits on an underside of pod base 30 to enclose and protect gear system 33. Base cover 31a includes a central aperture 31b through which an actuation mechanism (e.g. collet) of the elevator can be inserted to effect operation of gear system 33 and secured coupling of cassette 10 to base 30. Alternatively, base cover 31a can include additional features for coupling or aligning of pod base 30 during handling or storage. For example, base cover 31a can be molded with a recessed shape or include a contour that corresponds to a complementary contour of a respective elevator platform or pallet 81 for use in staging racks 80. Additional view of base cover 21 in relation to pod base 30 are shown in FIGS. 7A-7B. In various views depicted herein, pod base 30 is shown without base cover 31a for visibility of internal components of base 30.

In various embodiments, the solar cell carrying pod can include one or more plenums or chambers that accumulate a flow of inert gas for controlled distribution of inert gas into the pod during charging. These plenums can be defined by various components within the cover. FIGS. 6B-6C illustrate align mount 27 and plenum diffuser 25 attached within cover 21 that together define an upper and lower plenum through which the inert gas flows when charging the cassette through valve 23. As shown in FIGS. 6A-6B, align mount 27 includes top plate 27a extending partly along the top of pod cover 21 that defines an upper plenum 29 and an elongated lower portion 27b that extends vertically along the inside of pod cover 21 that defines, in combination with plenum diffuser 25, an elongated lower plenum 29'. Upper plenum 29 is directly under valve 23 gas and allows the flow of inert gas to accumulate before traveling through channels 28 and into elongated lower plenum 29' defined between plenum diffuser 25 and lower align mount portion 27b. Plenum diffuser 25 includes an array of openings 25a along its major face to distribute air flow through the stack of solar cells 1 within cassette 10. Typically, pod 20 is charged with an inert gas provided through valve 23 at a positive pressure. The inert gas can be introduced through valve after drawing a vacuum in the pod or can be introduced while allowing discharge of any air within the pod through a blood valve. Inert gas can be provided through valve at low pressures or relatively high pressures, typically about 1-5 atm) that allows for charging to be performed relatively quick, for example within 5 seconds or less, however, use of such pressures produces a relatively high flow rate that can potentially damage the delicate solar cell components stacked within the cassette, particularly if the gas flow is directed directly onto the upper-most wafer. To avoid this problem, upper plenum 29 allows gas to accumulate and redirect flow of gas into an elongate narrowed lower plenum for controlled distributed flow through plenum diffuser 25 and across the stack of solar cells.

In another aspect, plenum diffuser 25 to function as a spacer. Plenum diffuser 25 is configured to move towards the solar cells within cassette 10 when cover 21 is coupled to cover 21 so as to occupy any additional space at the front of cassette 10 where solar cells 1 were loaded. Typically, plenum diffuser 25 is configured to move towards the stack of solar cells so as to come in close proximity (e.g. about 1 mm or less) without contacting the solar cell stack. By occupying this space, plenum diffuser 25 prevents any undesired movement of the stack of solar cells that may inadvertently damage one or more solar cells. The above described movement of plenum diffuser 25 is provided by hinges 26 that couple plenum diffuser 25 to align mount 27. This movement is effected by engagement of bottom pins 25b extending downwards from plenum diffuser 25 towards pod base 30 so as to contact base 30 when coupled with cover 21 causing plenum diffuser 25 to swing upwards and towards the stack of solar cells.

Coupling features 13 and alignment features 14 in end plates 12 of carrier cassette 10 are configured to interface with corresponding features inside solar cell carrier pod 20 to constrain movement of cassette 10 and secure cassette 10 within pod 20. For example, as can be seen in FIGS. 6B-6C, an upper region of cover 21 include stub 29a that protrudes inward into the interior of pod 20 so as to interface and releasably couple with coupling feature 13 in the adjacent end plate 12 of cassette 10 so that cassette 10 is secured within pod 20 in the z direction. In this embodiment, stub 29a extends from upper plenum 29, although it is appreciated that such a feature could protrude inward from an inside wall of cover 21 or another associated component to provide the same effect. This interface constrains lateral movement of adjacent end plate 12 of cassette 10 within both the x-direction and y-directions, while still allowing movement in the z-direction when cassette 10 is withdrawn by retracting base 30 into tank receptacle 40. In various embodiments, end-plate 12 can include alignment feature 14 (e.g. three holes spaced apart by 120 degrees) that orient a front loading side toward a front side of pod 21 to facilitate loading and unloading of solar cells. Alignment feature 14 can interface with corresponding protrusions or pegs 30a extending from base or pegs 29a extending from the upper plenum 29. These alignment features maintain the x-y orientation and prevent movement in the x-direction and y-directions. When base 30 is securely coupled to cover 21, movement of cassette 10 in the z-direction is prevented by engagement of respective end plates 12 with each of upper plenum 29 and base 30. In various embodiments, end plate 12 can be further secured to base 30 with respect to the z-direction through coupling feature 13, when base 30 is removed from cover 21 and withdrawn into tank receptacle by use of collet 34, which is the same mechanism that effects release of base 30 from cover 21, as described below with respect to FIG. 7C. In such embodiments, upon insertion into base 30, collet 34 extends through the gear system 33 and through coupling features 13 in the respective end plate 12 coupled to base 30. Since the distal-most portion of collet 34 expands to a greater diameter than a more proximal portion, cassette 10 is secured in the z-direction while collet 34 is engaged with gear system 33 of base 30 and freely rotate in circular coupling feature 13 so that cassette 10 is secured to base 30 in each of the x, y and z-directions while base 30 is retracted on elevator 43 into tank receptacle 44.

Figure 7C:
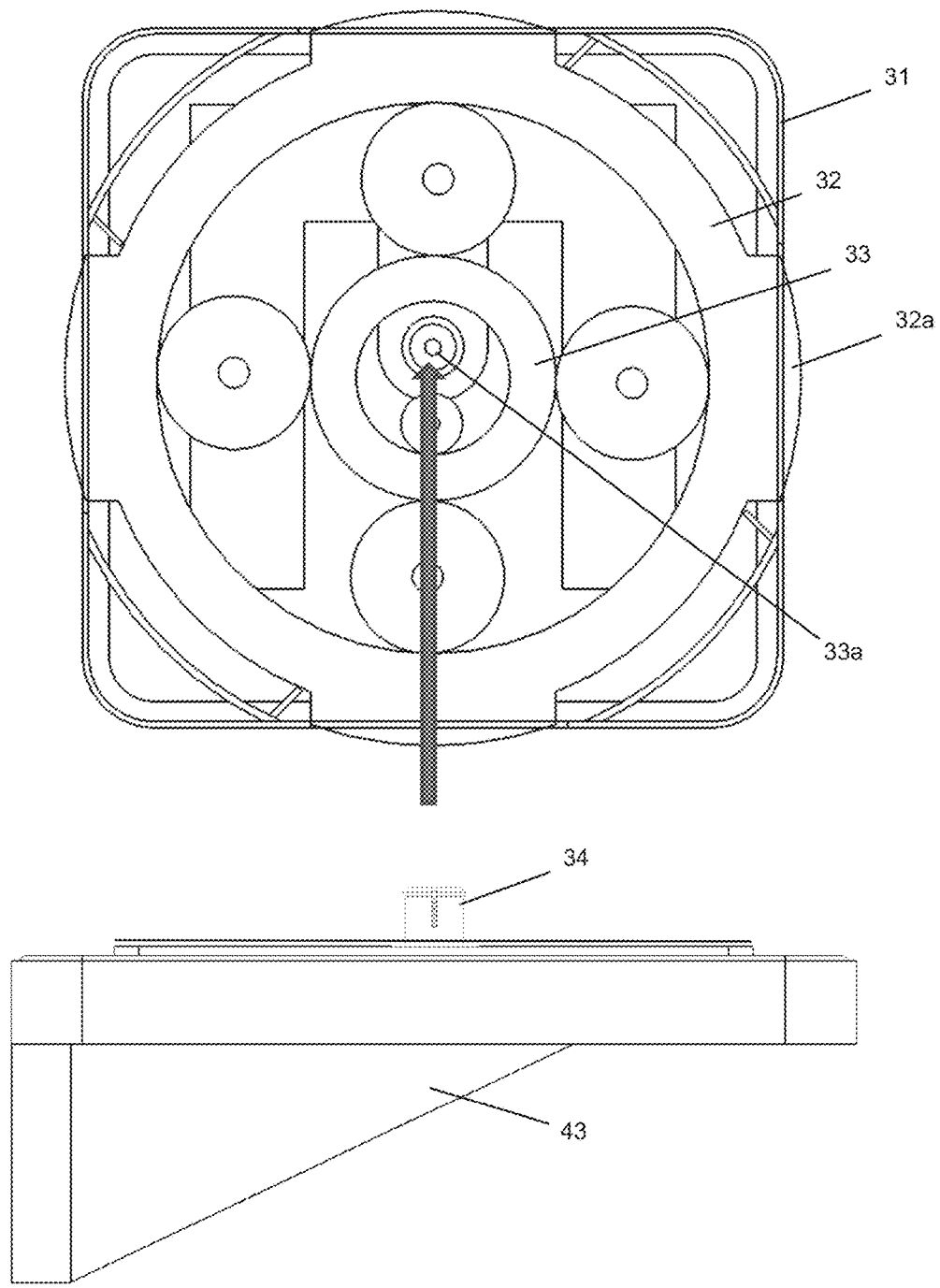
FIG. 7C illustrates a detail view of the gear system in an underside of the removable base of the solar cell carrying pod and an elevator platform of the tank receptacle having a motor-driven collet for operating the gear system of the solar cell carrying pod in accordance with various embodiments.
Figure 8A:
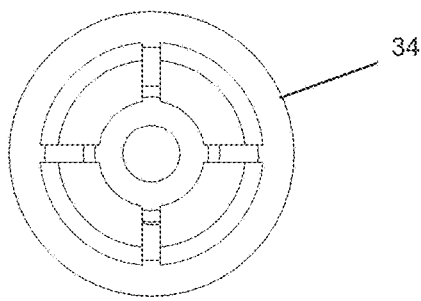
FIGS. 8A-8E illustrate detail views of an exemplary collet for interfacing with an end plate of a solar cell carrying carrier cassette and gear train of a base of a solar cell carrying pod in accordance with various embodiments.
Figure 8B:
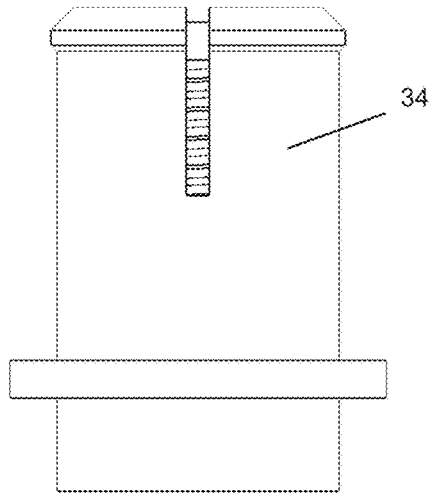
Figure 8D:
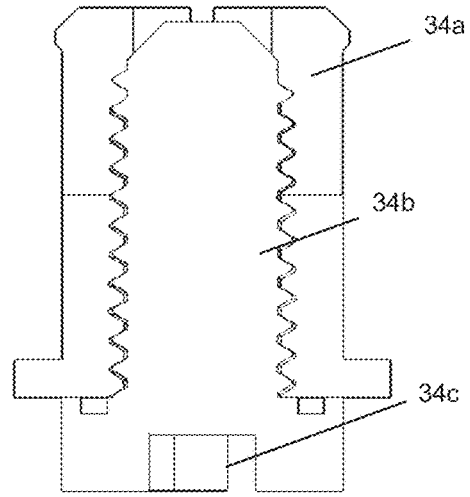
Figure 8C:
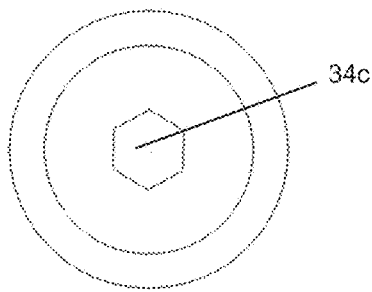
Figure 8E:
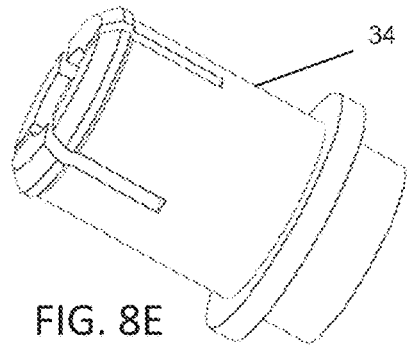

FIG. 7C illustrates the actuation mechanisms by which elevator platform 43 is coupled to and effects detachment and/or locking of pod base 30 to pod cover 21 in exemplary solar cell carrying pods 20. The actuation mechanism can be disposed within elevator platform 43 on which a respective pod base 30 is positioned by robotic arm 71. In this embodiment, the actuation mechanism is collet 34, which extends upwards so as to be received within corresponding collar 33a within gear system 33 of pod base 30. Motor-driven expansion and rotation of collet 34 circumferentially engages collar 33a and drives the gear system 33 so as to rotate locking ring 32 between an locked and unlocked position. Rotating collet 34 in one direction facilitates unlocking of pod base 30 from pod cover 21 while rotating collet 34 in the other direction facilitate locking of pod base 30 to pod cover. While in this embodiment collet 34 is used, it is appreciated that various other engagement mechanisms can be used to effect unlocking and locking of pod base 30 with pod cover 21.

Figure 9A:
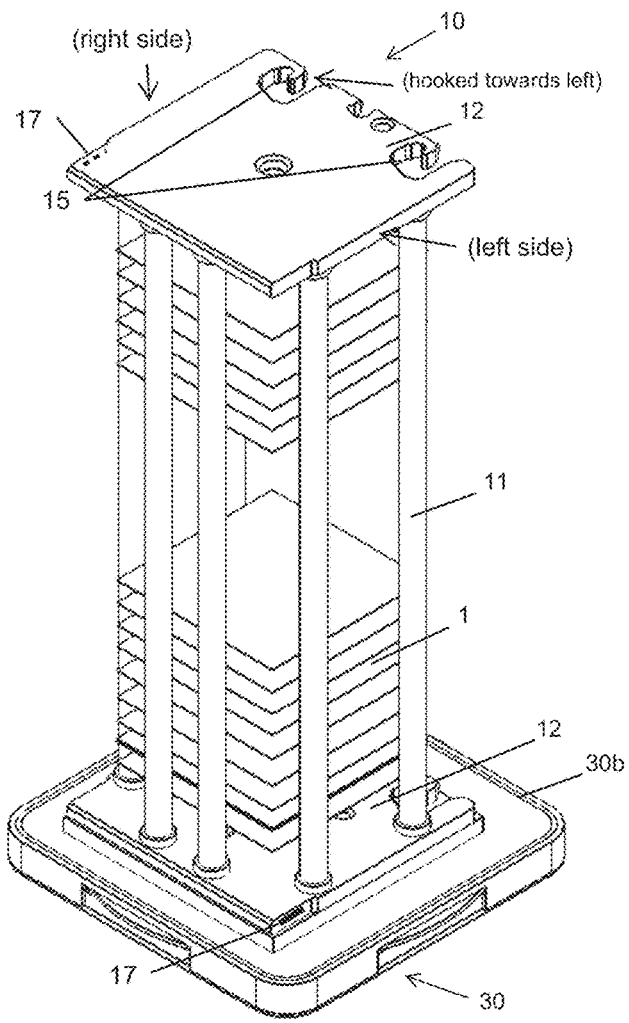
FIGS. 9A-9B illustrate a solar cell carrying cassette attached to a base for use in a solar cell carrying pod in accordance with various embodiments.
Figure 9B:
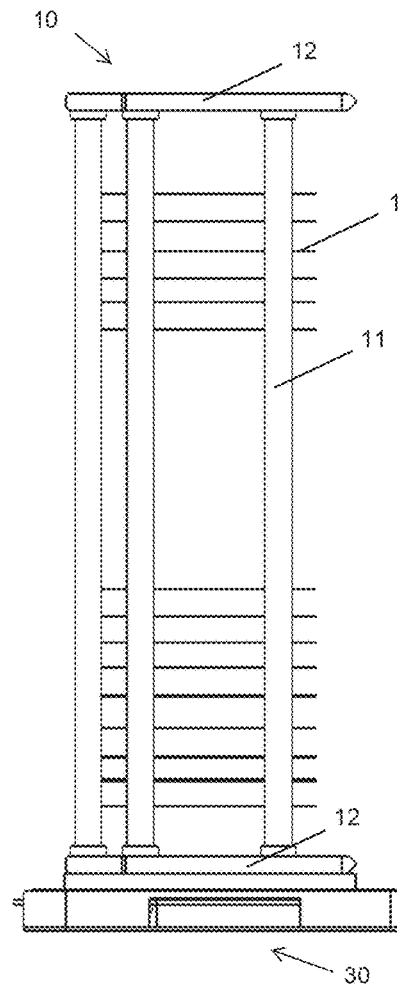

As shown in FIG. 7C, locking ring 32 includes locking blades 32a that extend outside of pod base housing 31 when locking ring 32 is rotated to the locked position. When positioned as such while pod cover 21 is disposed atop cover 21, locking blades 32a engage a corresponding surface along bottom ridge 21a of pod cover 21, thereby securely coupling base 30 with pod cover 21 with sufficient force to sealingly couple base 30 and pod cover 21 together. Typically, as shown in FIG. 9A, there are one or more lip seals 30b circumscribing the top surface of pod base 30 for engaging a bottom facing surface of pod cover 21. When sealed, lips seals 30a can maintain the sealed environment within the pod at a slight positive pressure for days, weeks or months, although typically about 60 days or more. When collet 34 is rotated to unlock base 30 from cover 21, gear system 33 effects rotation of locking ring 32 so that locking blades 32a are rotated and stored within pod base housing 31 in each rounded corner of base 30. In this position, locking ring 32 is no longer engaged with slots in bottom ridge of pod cover 21 so that pod base 30 is unlocked and can be detached. Elevator base 34 can then be lowered with detached base 30 along with attached cassette 10 to facilitate unloading or loading of cassette 10 with solar cells, as shown for example in FIGS. 4A-4D. An example of collet 34 is shown in FIGS. 8A-8E. Collet includes a spreadable collar 34a, an internal threaded bolt 34b and a proximal head 34c by which collet 34 can be driven by a mechanism disposed within elevator base 43. Rotation of threaded bolt 34 causes spreadable collar 34a to expand radially so as to securely engage a corresponding collar 33a within gear system 33 and coupling feature 13 to secure cassette 10 to base 30 while rotation of collet 34 drives gear system 33 to effect locking/unlocking of base 30 from cover 21 via rotation of locking ring 32.

FIGS. 9A-9B and 10A-10C illustrate exemplary solar cell carrying cassettes 10 for use within solar cell carrying pods and transfer systems in accordance with various embodiments. Each cassette 10 typically includes pair of end plates 12 spaced apart by sets of rods 11 that form a framework defining an interior space for supporting a stack of solar cells. Typically, cassette 10 includes three pairs of rods 11 extending between edges of three sides of end plates 12 so as to define a square shaped space for supporting the stack of solar cells while leaving a front side of the space open for loading and unloading of the solar cells from the stack.

Figures 10A, 10B:
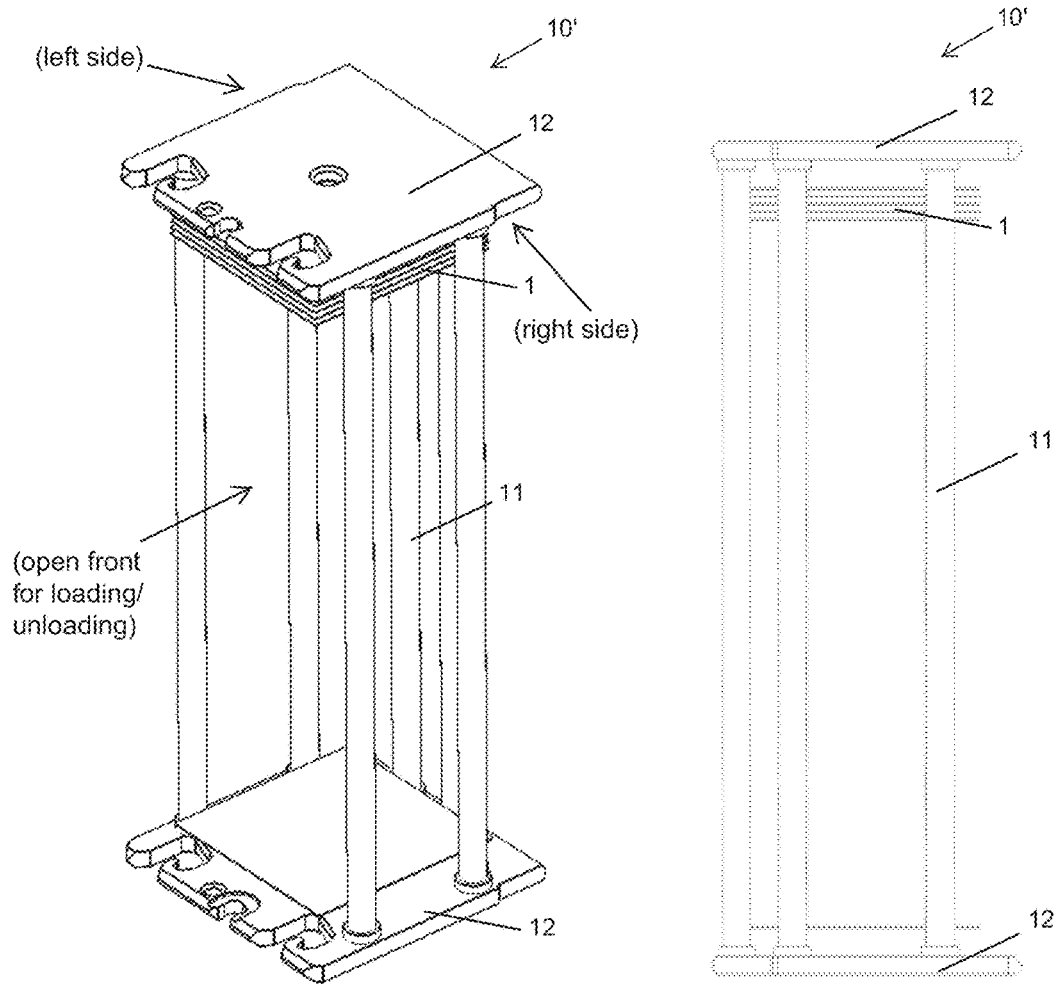
FIGS. 10A-10C illustrate alternative solar cell carrying cassettes suitable for use in a solar cell carrying pod in accordance with various embodiments.
Figure 10C:
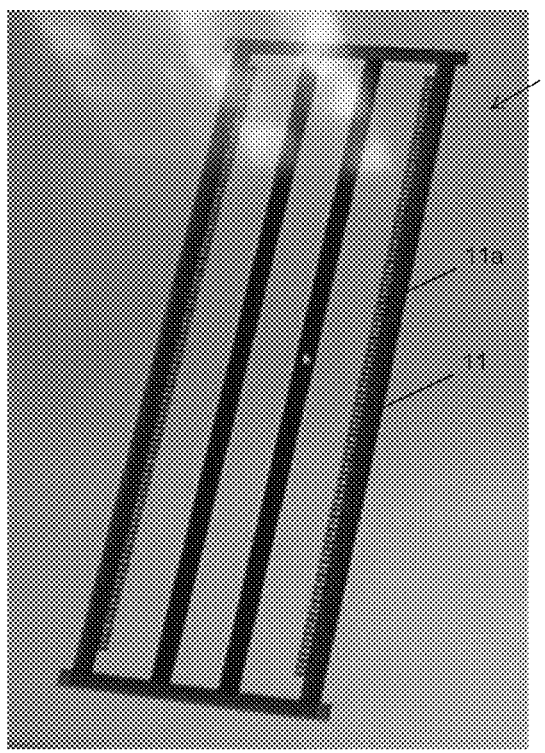

As shown in FIG. 10C and FIGS. 11A-11C, rods 11 can include support features, such as 11a, 11b, 11c 11 for supporting each of the solar cells within a stack, such that in combination, the pairs of rods define a number of spaced apart shelf positions along which solar cells can be inserted or withdrawn. It is appreciated that the support features 11 can be spaced apart to allow more space between each adjacent solar cell within the stack, as shown in FIG. 9A, or can be closer to allow relatively little space between adjacent solar cell components within a stack, as shown in FIG. 10A.

Figure 11A:
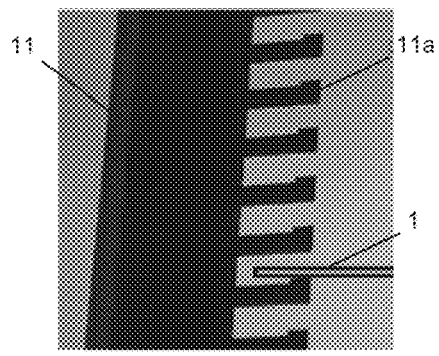
FIGS. 11A-11C illustrate solar cell carrying features defined in the rods of exemplary solar cell carrying cassettes for use in a solar cell carrying pod and transfer system in accordance with various embodiments.
Figure 11B:
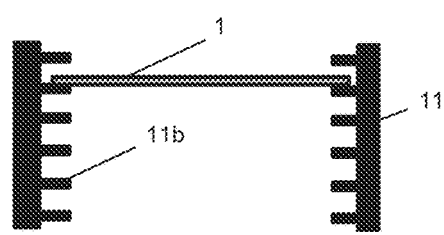
Figure 11C:
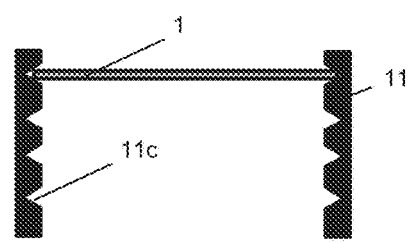

In various embodiments, support features of the rods can include any feature suitable for supporting a solar cell. For example, as shown in FIGS. 11A-11C, solar cell support features can be defined as a reclined L-shaped support 11a, a shelf-like support 11b, or a recess or notch 11c. Different features may be desirable depending on the stage of fabrication of the solar cell component being supported. For example, in a relatively early stage of fabrication, when the solar cell component is relatively fragile and may include developer residue along the edges, the L-shaped support in 11a may be desirable as it avoids contacts and associated stresses being applied at the outermost edges of the solar cell component.

Figure 12A:
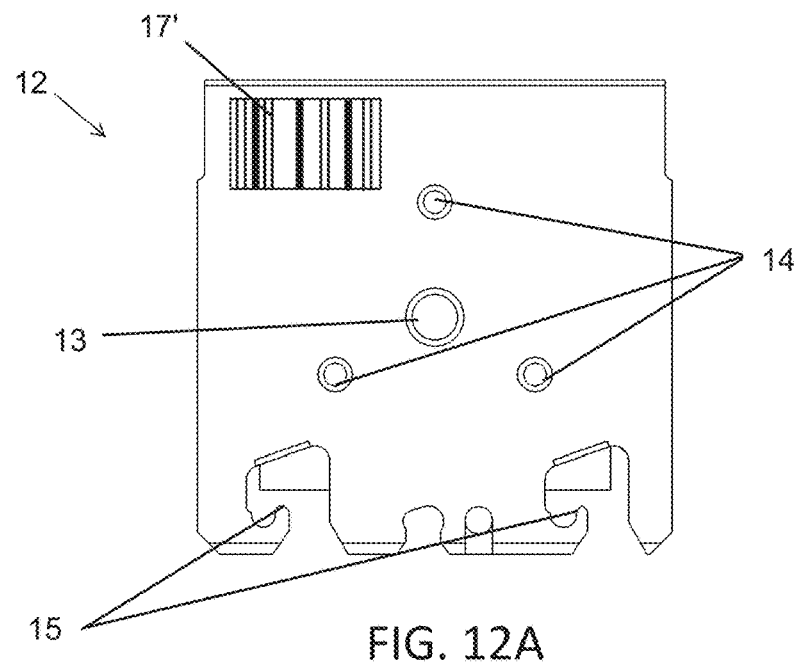
FIGS. 12A-12B illustrate example end plates of a solar cell carrying cassette for use in a solar cell carrying pod and transfer system in accordance with various embodiments.
Figure 12B:
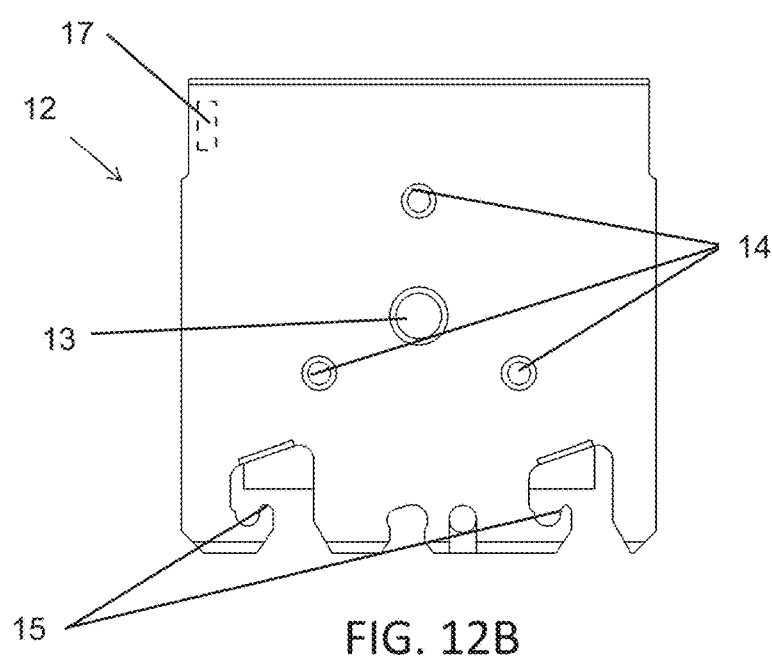

FIGS. 12A-12B illustrate exemplary end plate 12 for use in a cassette 10. Each end plate 12 is formed of a material suitable for use in a cassette used for storing solar cells. Typically, end plates 12 and rods 11 are each formed of a metal, such as stainless steel, that provides sufficient strength for use in a cassette while being resistant to various chemicals used in the solar cell fabrication process. It is appreciated that one or both of end plates or rods may also be formed of polymers or combination of materials as desired.

As shown in FIGS. 12A-12B, end plate 12 can include one or more interfacing features that can be used as coupling features 13, alignment features 14 and handling features 15. In various embodiments, coupling feature 13 includes a central hole dimensioned and arranged to engage with corresponding features in pod base 30 to ensure cassette 10 is properly aligned and coupled to base 30. In addition, one or more alignment features 14 can be defined as a set of three holes spaced about the central hole by 120 degrees and can be used to align and/or inhibit lateral movement or rotation of cassette 10 while coupled within pod 20 and can be defined as notched features or hooked portions on one side. Handling features 15 can be used to facilitate transport of the cassette during various other processes, such as cleaning or storage of cassettes 10. In one aspect, handling features 15 allow a bar/pin assembly (not shown) to engage the features and pick up the cassette under gravity. These features are typically used in batch processing on wet benches where the automation uses these features to pick up the cassette and dip them into a chemical bath. It is appreciated that a particular interfacing feature can be multi-functional—that is, a single feature can be used to couple, align and/or handle the cassette.

As can be seen in FIG. 9A, cassette 10 can be considered to have a left-side and a right-side relative an open front loading side (see FIG. 10A). The interfacing features in each end plate 12 are configured such that cassette 10 is reversible, that is, cassette 10 can be coupled to base 30 within pod 20 by either end plate 12. However, in embodiments having third interfacing features 15 with hooked portions that both hook towards the same side, cassette 10 can be considered to have two orientations depending on which end plate 12 of the pair is coupled to base 30. The two orientations can include a left-side orientation in which interfacing features 15 both hook towards the left as shown in FIG. 9A and a right-side orientation in which interfacing features 15 both hook towards the right. In such embodiments having different orientations, identifier 17 can be included at or near a side edge of each end plate on opposite sides of cassette 10 such that regardless of which end plate 12 is coupled with base 30, at least one identifier is at the same location, for example the bottom left side of cassette 10 adjacent base 30 in FIG. 9A. This configuration facilitates identification of cassette 10 while transporting or processing pod 20 by use of an RFID sensor at one fixed location outside the pod regardless of which orientation cassette 10 is coupled within pod 20. In various other embodiments, identifiers 17 could be included at a rear edge of each end plate 12 so as to be readily identifiable when passing a sensor disposed near a rear of the cassette, regardless of which end plate is coupled with base 30.

As shown in FIGS. 12A-12B, each end plate 12 can include an identifier 17, 17' that can be used by system to identify a particular cassette 10 and associated solar cells, or may be used to confirm the presence of cassette 10 within pod. Such identification feature can include a visual identifier 17', such as the barcode shown in FIG. 12A, a detectable identifier 17, such as the RFID chip shown in FIG. 12B, or any other feature suitable for identification. Use of a detectable identifier, in particular an RFID chip, is advantageous as it allows cassette 10 to be readily identified by the system even when sealed within pod 20 where other identification features or identifiers may be obscured from view. In the embodiment of FIG. 12A, identifier 17 is disposed in the edge of end plate 12 so as to be readable from an RFID sensor disposed adjacent the pod during handling and/or storage of the pod. For example, as shown in FIG. 3B, each of RFID sensors 47 positioned on tank receptacle 40 adjacent ports 42a, 42b can detect identifier 17 on at least one end plate 12 of a respective cassette 10 retracted into the interior of tank receptacle 40. It is appreciated that such features can be defined in various other locations as desired for a particular function or application.

The embodiments of the present inventions should not be limited in scope by the embodiments described herein. Indeed, various modifications of the embodiments of the present inventions, in addition to those described herein, will be apparent to those of ordinary skill in the art from the foregoing description and accompanying drawings and claims. Thus, such modifications are intended to fall within the scope of this invention. Further, although some of the embodiments of the present invention have been described herein in the context of a particular implementation in a particular environment for a particular purpose, those of ordinary skill in the art will recognize that its usefulness is not limited thereto and that the embodiments of the present inventions can be beneficially implemented in any number of environments for any number of purposes. Accordingly, this disclosure should be construed in view of the full breath and spirit of the embodiments disclosed herein and claimed below.

What is claimed is:

1. A solar cell carrying cassette adapted for use in a solar cell carrying pod having a removable base with a coupling mechanism, wherein the coupling mechanism comprises a plurality of protruding features including a motor-driven collet, the cassette comprising:
    a pair of end plates having a plurality of rods extending therebetween and dimensioned to hold a plurality of solar cells between the pair of end plates;
    a first and second interfacing feature in each of the pair of end plates configured for operably engaging with the coupling mechanism in the base of the solar cell carrying pod that facilitates releasable coupling of the cassette with the base, wherein the first interfacing feature comprise a central aperture configured to engage with the motor-driven collet of the base and the second interfacing feature comprises a plurality of alignment holes arranged and configured to receive a plurality of alignment protrusions of the base, the base being operable to facilitate sealing and attachment of the base with a cover of the solar cell carrying pod, wherein the plurality of holes are disposed in substantially the same arrangement in each end plate such that either end plate is operably engageable with the same coupling mechanism in the base to operate in substantially the same manner regardless of which end plate is operably engaged with the coupling mechanism; and an identifier in each of the pair of end plates, the identifier allowing for ready identification of the cassette when disposed within the solar cell carrying pod or coupled to the base of the solar cell carrying pod.

2. The solar cell carrying cassette of claim 1, the identifier being disposed on each of the pair of end plates along opposite sides of the cassette so as to be identifiable from a single location relative to the pod regardless of the orientation of the cassette within the pod.

3. The solar cell carrying cassette of claim 1, wherein the identifier is an RFID chip attached to each of the pair of end plates.

4. The solar cell carrying cassette of claim 1, wherein the identifier on each of the pair of end plates contains identifying information unique to the cassette.

5. The solar cell carrying cassette of claim 4, wherein the identifiers contain common identifying information so that the same identifying information is read regardless of which of the pair of end plates is coupled to the base.

6. The solar cell carrying cassette of claim 1, wherein the the central aperture dimensioned and positioned so as to be alternatively coupleable with the mechanism extending from the base at a bottom of the cover or a protrusion extending inward from an upper portion of the cover opposite the base.

7. The solar cell carrying cassette of claim 6, wherein the plurality of alignment holes are distributed about the central aperture in an arrangement to receive a plurality of pegs in either of the base and cover of the solar cell carrying pod.

8. The solar cell carrying cassette of claim 7, wherein the plurality of rods are arranged so as to define an front open side of the cassette to allow placement of solar cells within the plurality of rods for storage, wherein the second interfacing feature is adapted to orient the front open side of the cassette towards a front of the pod to facilitate loading and unloading of the plurality of solar cells from the cassette.

9. The solar cell carrying cassette of claim 8, further comprising:

a third interfacing feature in each of the end plates, wherein the third interfacing feature comprises a pair of hooked notches along a front loading side of each end plate that are oriented towards one side of the cassette relative the front side of the cassette such that the cassette is coupleable to the base in two different orientations.

10. The solar cell carrying cassette of claim 9, wherein the cassette has a left side and a right side relative the front loading side, the pair of end plates comprises a first and second end plate and the two orientations comprise a left-side orientation and a right-side orientation, wherein in the left-side orientation, the pairs of hooked notches are oriented to the left side of the cassette when a first end plate is coupled to the base, and in the right-side orientation, the pairs of hooked notches are oriented towards the right side of the cassette when the second end plate is coupled to the base.

11. The solar cell carrying cassette of claim 10, wherein the identifier is disposed on each of the pair of end plates along opposite sides of the cassette so as to be identifiable from a single side of the left and right sides of the cassette regardless of whether the cassette is coupled to the base in the left-side orientation or the right-side orientation.

12. The solar cell carrying cassette of claim 1, wherein the plurality of rods comprise a plurality of support features adapted to support the plurality of solar cells regardless of which of the pair of end plates is coupled with the base of the solar cell carrying pod.

13. The solar cell carrying cassette of claim 12, wherein the plurality of support features comprise a plurality of notches and/or shelf-like protrusions adapted for holding the plurality of solar cells while maintaining separation between adjacent solar cells of the plurality, wherein the plurality of support features are adapted to support the plurality of solar cells regardless of which of the pair of end plates is coupled with the base of the solar cell carrying pod.

14. A cassette adapted for carrying components formed in a semi-conductor fabrication process to facilitate storage in a solar cell carrying pod having a removable base with a coupling mechanism, the coupling mechanism comprising a plurality of protruding alignment features and a collet, the cassette comprising:

a pair of end plates having a plurality of rods extending therebetween and configured to support the pair of end plates in a parallel position and to support the semi-conductor components therebetween, wherein the pair of end plates comprise a first end plate and a second end plate;

one or more interfacing features in each of the pair of end plates for operably engaging with the coupling mechanism for facilitating loading or unloading of the components from the carrier and/or handling of the cassette, wherein the one or more interfacing features comprise a plurality of holes in each plate configured for interfacing with the plurality of protruding alignment features and the collet, wherein the plurality of holes are of substantially the same configuration such that either end plate is operably engageable with the couple mechanism to allow the motor-driven collet of the base to operate in substantially the same manner regardless of which end plate is interfaced with the coupling mechanism of the base of the solar cell carrying pod; and an identifier disposed on each of the pair of end plates, the identifier allowing for ready identification of the cassette and/or the components supported within the cassette.

15. The cassette of claim 14, an identifier disposed on each of the pair of end plates, the identifier allowing for ready identification of the cassette and/or the components supported within the cassette, wherein the identifiers are positioned so as to be identifiable from a single location regardless of the orientation of the cassette.

16. The cassette of claim 14, further comprising: an identifier disposed on each of the pair of end plates, the identifier allowing for ready identification of the cassette and/or the components supported within the cassette, wherein each identifier is an RFID chip attached to each of the pair of end plates.

17. The cassette of claim 14, further comprising: an identifier disposed on each of the pair of end plates, the identifier allowing for ready identification of the cassette and/or the components supported within the cassette, wherein the identifier on each end plates contains common identifying information such that the same identifying information is read regardless of which of the pair of end plates is coupled to the base.

18. The cassette of claim 14, further comprising: an identifier disposed on each of the pair of end plates, the identifier allowing for ready identification of the cassette and/or the components supported within the cassette, the identifier being disposed on each of the pair of end plates along opposite sides of the cassette so as to be identifiable from a single location relative the pod regardless of the orientation of the cassette.

19. A solar cell carrying cassette adapted for use in a solar cell carrying pod having a removable base with a coupling mechanism, wherein the coupling mechanism comprises a plurality of protruding features, the cassette comprising:

a pair of end plates having a plurality of rods extending between and supporting the pair of end plates parallel to each other, wherein the plurality of rods being are configured to support a stack of solar cells therebetween and arranged to define an open front of the cassette through which the stack of solar cells are inserted and removed, the pair of end plates includes;

one or more interfacing features comprising a plurality of holes in each of the pair of end plates configured for operably engaging with one or more corresponding features associated with a base of the solar cell carrying pod, the base being operable to sealingly couple with a cover of the solar cell carrying pod with the cassette coupled therebetween, wherein the pair of end plates are configured such that the plurality of holes mirror one another relative to a mid-plane between and parallel to the pair of end plates such that the cassette can be oriented with either of the pair of end plates coupled to the base, wherein the plurality of holes are disposed in substantially the same arrangement in each end plate such that either end plate is operably engageable with the same coupling mechanism in the base to operate in substantially the same manner regardless of which end plate is operably engaged with the coupling mechanism; and an RFID chip disposed in each of the pair of end plates on opposite sides of the respective end plates relative each other so as to allow for ready identification of the cassette from a single location relative the pod, while the cassette is coupled within the pod, regardless of the orientation of the cassette within the pod.

20. The cassette of claim 19, wherein the plurality of rods are arranged to define an open front lighting side to allow placement of the plurality of solar cells within the cassette, wherein the identifier is an RFID chip disposed in one edge of each of the pair of end plates and disposed on opposite sides of the cassette relative the front loading side of the cassette such that at least one of the RFID chips is readable from a single side of the cassette.

21. The cassette of claim 14, further comprising:

the solar cell carrying pod having the removable base with the coupling mechanism, the coupling mechanism comprising the plurality of protruding features configured for operably engaging with the plurality of holes in each end plate of the cassette.

* * * * *